United States Patent
Soga et al.

(10) Patent No.: US 7,722,962 B2
(45) Date of Patent: *May 25, 2010

(54) SOLDER FOIL, SEMICONDUCTOR DEVICE AND ELECTRONIC DEVICE

(75) Inventors: Tasao Soga, Hitachi (JP); Hanae Hata, Yokohama (JP); Toshiharu Ishida, Fujisawa (JP); Kanko Ishida, legal representative, Fujisawa (JP); Tetsuya Nakatsuka, Fujisawa (JP); Masahide Okamoto, Yokohama (JP); Kazuma Miura, Sanjo (JP)

(73) Assignee: Renesas Technology Corp., Tokyo (JP)

( * ) Notice: Subject to any disclaimer, the term of this patent is extended or adjusted under 35 U.S.C. 154(b) by 375 days.

This patent is subject to a terminal disclaimer.

(21) Appl. No.: 10/451,610

(22) PCT Filed: Dec. 19, 2001

(86) PCT No.: PCT/JP01/11152

§ 371 (c)(1),
(2), (4) Date: Mar. 31, 2004

(87) PCT Pub. No.: WO02/49797

PCT Pub. Date: Jun. 27, 2002

(65) Prior Publication Data

US 2006/0061974 A1    Mar. 23, 2006

(30) Foreign Application Priority Data

Dec. 21, 2000   (JP) .............................. 2000-393267

(51) Int. Cl.
H05K 1/02   (2006.01)
H05K 1/00   (2006.01)
B32B 15/20  (2006.01)

(52) U.S. Cl. .................. 428/620; 428/646; 428/674; 361/743; 257/690; 257/779; 228/17

(58) Field of Classification Search .............. None
See application file for complete search history.

(56) References Cited

U.S. PATENT DOCUMENTS

| | | | | |
|---|---|---|---|---|
| 5,421,081 A * | 6/1995 | Sakaguchi et al. | ............ | 29/840 |
| 5,709,338 A | 1/1998 | Shirai et al. | | |
| 5,830,292 A * | 11/1998 | Eiter et al. | ................. | 148/528 |
| 5,965,197 A | 10/1999 | Jin et al. | | |
| 6,160,224 A | 12/2000 | Ogashiwa et al. | | |
| 6,563,225 B2 * | 5/2003 | Soga et al. | ................. | 257/782 |
| 6,872,465 B2 * | 3/2005 | Soga et al. | ................. | 428/570 |
| 2002/0171157 A1 * | 11/2002 | Soga et al. | ................. | 257/783 |
| 2004/0007384 A1 * | 1/2004 | Soga et al. | ................. | 174/260 |

FOREIGN PATENT DOCUMENTS

JP   53-061973   6/1978

(Continued)

Primary Examiner—Jennifer McNeil
Assistant Examiner—Jason L Savage
(74) Attorney, Agent, or Firm—Townsend and Townsend and Crew LLP

(57) ABSTRACT

A solder foil formed from a material comprising particles of Cu, etc. as metal particles and Sn particles as solder particles by rolling is suitable for solder bonding at a high temperature side in temperature-hierarchical bonding, and semiconductor devices and electronic devices produced by use of such solder bonding have distinguished reliability of mechanical characteristics, etc.

5 Claims, 15 Drawing Sheets

FOREIGN PATENT DOCUMENTS

| | | |
|---|---|---|
| JP | 05-136286 | 6/1993 |
| JP | 06-216167 A | 5/1994 |
| JP | 09-083128 A | 3/1997 |
| JP | 10-118783 A | 5/1998 |
| JP | 10-163270 | 6/1998 |
| JP | 11-245082 A | 9/1999 |

* cited by examiner (a)

(b)

(c)

(a)

(b)

(a)

(b)

(c)

(a)

(b)

(c)

(d)

(a)

(b)

(c)

(a)

(b)

(c)

(a)

(b)

(a)

(b)

(a)

(b)

SOLDER FOIL, SEMICONDUCTOR DEVICE AND ELECTRONIC DEVICE

TECHNICAL FIELD

The present invention relates to a solder foil formed from a material comprising metal particles such as copper (Cu) particles or balls and solder particles such as tin (Sn) particles or balls by rolling, and a semiconductor device and an electronic device using the solder foil.

BACKGROUND ART

In the case of solders of Sn—Pb system, it has been possible to carry out temperature-hierarchical bonding, which comprises soldering lead (Pb)-rich Pb-5Sn (melting point: 314-310° C.), Pb-10Sn (melting point: 302-275° C.), etc. as high temperature series solders at temperatures of approximately 330° C., and then bonding a Sn-37Pb eutectic mixture (melting point: 183° C.) as low temperature series solders without melting the first soldered portions. These solders have been capable of bonding Si chips, etc., which are flexible and high in deformability and thus is easy to break, to a substrate having a different coefficient of thermal expansion. Such a temperature-hierarchical bonding has been applied to semiconductor devices of chip die-bonding type, semiconductor devices of chip flip-chip-bonding type such as BGA, CSP, etc. That is, this means that a solder for use within the semiconductor device and a solder for bonding a semiconductor device itself to a substrate undergo temperature-hierarchical bonding.

In every field, there is now a growing tendency to make the solder lead-free.

Sn—Ag eutectic series (melting point: 221° C.), Sn—Ag—Cu eutectic series (melting point: 221°-217° C.) and Sn—Cu eutectic series (melting point: 227° C.) are now the mainstreams of Pb-free solders. A lower soldering temperature is desirable for the surface mounting in view of the heat resistance of parts, but actually it is approximately 235°-245° C. in the case of Sn—Ag—Cu eutectic series having a possibly lowest bonding temperature in view of the necessity for assuring a wettability to attain the reliability and also in view of considerable temperature fluctuations throughout a substrate in spite of using a furnace with distinguished temperature uniformity control. Thus, solders for the hierarchical bonding, which can withstand such a soldering temperature, must have a melting point of at least 250° C., but actually any Pb-free solders for use on the high temperature side of temperature-hierarchical bonding, which can be used in combination thereof, is not yet available. Sn-5Sb (melting point: 240°-232° C.) is a most possible Pb-free solder composition, but is not available for the temperature-hierarchical bonding because of melting thereof.

Au-20Sn (melting point: 280° C.) is known as a solder of higher temperature series, but it is so hard and expensive that its use is restricted to a narrow range. Particularly in bonding Si chips to a material having a different coefficient of thermal expansion and also in bonding of large chips, the Au-20Sn solder is not available, because it is so hard as to break Si chips with high possibility.

DISCLOSURE OF INVENTION

An object of the present invention is to provide a semiconductor device and an electronic device by quite a novel solder bonding, and particularly to provide solder bonding on the high temperature side in the temperature hierarchical bonding.

Another object of the present invention is to provide quite a novel solder foil.

The present invention provides a solder foil formed from a material comprising metal particles such as Cu particles or balls and solder particles such as Sn particles or balls by rolling.

The present invention also provides an electronic device, which comprises a first electronic device, a second electronic device, and a third electronic device, characterized in that the first electronic device and the second electronic device are bonded to each other by a first solder foil as described above, and the second electronic device and the third electronic device are bonded, to each other by a second solder having a lower melting point than that of the first solder.

The present invention further provides a semiconductor device, which comprises a semiconductor chip, a tab on which the semiconductor chip is to be disposed, and a lead serving as a connection terminal to the outside, an electrode on the semiconductor chip being bonded to the lead by wire bonding, characterized in that the semiconductor chip and the tab are bonded to each other by a solder foil formed from a material comprising a mixture of metal particles and solder particles as described above.

Figure 1:
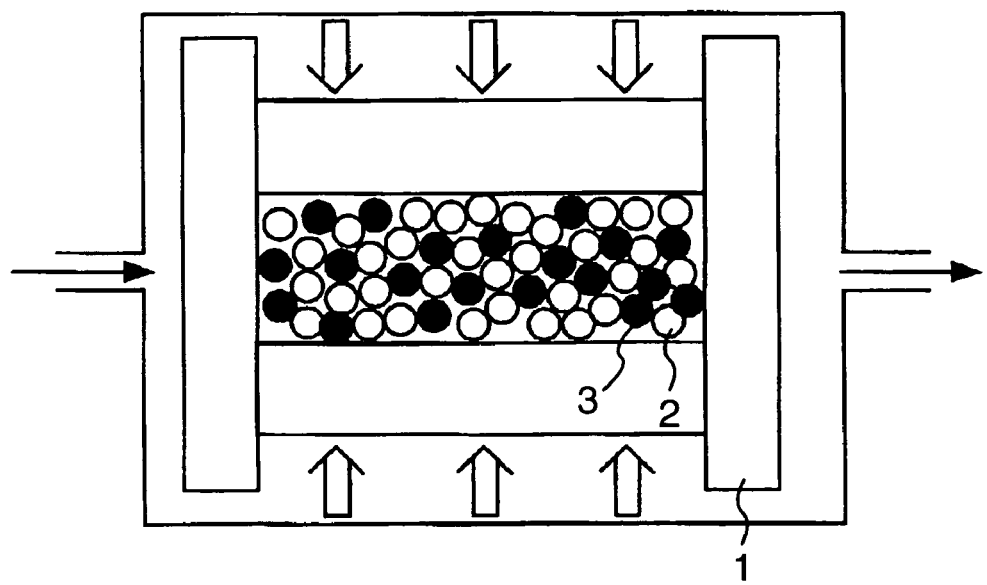
FIG. 1 is views showing manufacturing steps of a composite metal from composite balls.
Figure 1:
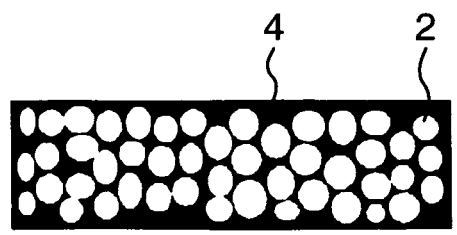
Figure 1:
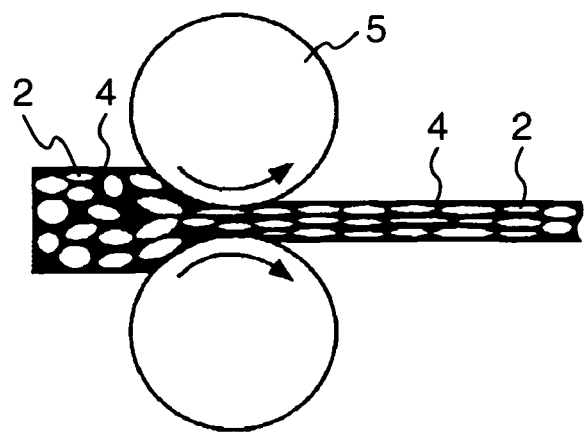

In the drawings, reference numerals denote the following members:

1 . . . carbon jig, 2 . . . Cu ball, 3 . . . Sn ball, 4 . . . Sn, 5 . . . roll, 6 . . . plastic ball, 7 . . . resistance heater tool, 8 . . . Si chip, 9 . . . vacuum suction hole, 10 . . . nitrogen, 11 . . . solder foil, 12 ... silicone gel, 13 ... Al₂O₃ substrate, 14 ... W (sintered)-Cu plated electrode, 15 ... heater for preheating, 16 ... thermocouple for temperature measurement, 17 ... Cu—Sn combination foil, 18 ... bump, 19 ... soft resin, 20 ... lead, 21 ... solder ball bump, 22 ... printed circuit board, 23 ... Al fin, 24 ... bonded portion with fin, 25 ... bonded portion with lead, 26 ... lead, 27 ... solder foil, 28 ... terminal of substrate, 29 ... module substrate, 30 ... terminal, 31 ... Cu, 32 ... organic substrate, 33 ... Cu throughhole conductor, 34 ... Ag—Pd conductor, 35 ... wire bond, 36 ... AlN interposer substrate, 37 ... connection terminal, 38 ... Cr—Cu—Au, 39 ... die bonding, 40 ... solder foil, 41 ... press, 42 ... Ni—Au-plated metallization layer, 43 ... interposer substrate, 44 ... Cr—Ni—Au metallization layer, 45 ... electroless Ni plating, 46 ... electrical Ni plating, 47 ... solder, 48 ... Cu disc, 49 ... Cu base, 50 ... Al₂O₃ insulation substrate, 51 ... Cu lead, 52 ... chip part, 53 ... Cu pad, 54 ... TQFP-LSI, 55 ... Sn—Ag—Cu system solder, 56 ... lead, 57 ... dam cut portion, 58 ... resin, 59 ... throughhole, 60 ... W—Ni—Au thick film electrode, 61 ... W—Ni (or Ag—Pd, Ag) thick film conductor, 62 ... Au-plated electrode, 63 ... caulked portion, 64 ... heat diffusion plate (header), 65 ... lead frame, 66 ... tab, 67 ... electroconductive paste, 68 ... solder, 69 ... fiber, 70 ... Cu netting (lateral cross-section), 71 ... Cu netting (longitudinal cross-section), 72 ... solder (sea), 73 ... long and slender fiber, and 74 ... oblong fiber

BEST MODES FOR CARRYING OUT THE INVENTION

Among the inventions disclosed herein to attain the aforementioned objects, typical ones are briefly outlined below:

(1) A solder foil formed from a material comprising metal particles and solder particles by rolling.
(2) A solder foil formed from a solder material comprising Cu particles and Sn particles by rolling.
(3) A solder foil formed from a solder comprising Cu and Sn by pressing, where Cu is in a particulate state and Sn is in a state of filling interspaces between the Cu particles.
(4) A solder foil as described in said item (2) or (3), wherein when the solder foil is subjected to reflowing at least one portion of the Cu particle surfaces is covered by $Cu_6Sn_5$.
(5) A solder foil as described in said item (2) or (3), wherein when the solder foil is subjected to reflowing the Cu particles and the Sn after plastic deformation are bonded to each other by a compound comprising $Cu_6Sn_5$.
(6) A solder foil as described in said items (2) to (5), wherein the Cu particles have particle sizes of 10-40 μm.
(7) A solder foil as described in said items (2) to (5), wherein the Cu particles have particle sizes of 3-10 μm.
(8) A solder foil as described in said items (2) to (7), wherein the Cu particles have a Ni plating or Ni/Au plating layer on the surfaces.
(9) A solder foil as described in said items (2) to (8), wherein at least Cu-exposed portions of the foil are Sn-plated.
(10) A solder foil as described in said items (1) to (9), wherein the solder foil has a thickness of 80 μm-150 μm.
(11) A solder foil as described in said items (1) to (9), wherein the solder foil has a thickness of 150 μm-250 μm.
(12) A solder foil as described in said items (1) to (11), wherein plastic particles are further contained.
(13) A solder foil as described in said item (2) or (3), wherein other particles having a lower coefficient of thermal expansion than that of Cu are further contained.
(14) A solder foil as described in said item (2) or (3), wherein other particles having a lower coefficient of thermal expansion than that of Cu are particles of Invar alloy series, silica, alumina, AlN (aluminum nitride), or SiC.
(15) A solder foil as described in said item (2) or (3), wherein In particles are further contained.
(16) A solder foil as described in said items (2) or (3), wherein the Cu particles and the Sn particles are mixed together in vacuum, in a reductive atmosphere or in an inert gas atmosphere, and then formed into a foil by pressing.
(17) A solder foil as described in said item (2) or (3), wherein a draft percentage is 15%-20%.
(18) A solder foil formed from a material comprising metal fibers and solder particles by rolling.
(19) A solder foil formed from a solder material comprising Cu metal fibers and Sn particles by rolling.
(20) A solder foil as described in said item (19), wherein the Cu metal fibers of the solder material are in an oblong shape.
(21) A solder foil formed from a solder material comprising particles of Al, Au or Ag, and Sn particles by rolling.
(22) A solder foil formed from a solder material comprising particles of Zn—Al system alloy or Au—Sn system alloys, and Sn particles by rolling.
(23) An electronic device, which comprises a first electronic device, a second electronic device, and a third electronic device, wherein the first electronic device and the second electronic device are bonded to each other by a first solder foil as described in said items (1) to (22), and the second electronic device and the third electronic device are bonded to each other by a second solder having a lower melting point than that of the first solder foil.
(24) An electronic device, wherein a first electronic device and a second electronic device are bonded to each other by a solder foil formed from a material comprising Cu particles and Sn particles by rolling, and the second electronic device and a third electronic device are bonded to each other by a solder having a lower melting point than that of the solder foil.
(25) A semiconductor device, which comprises a semiconductor chip, a tab on which the semiconductor chip is to be disposed, and a lead serving as a connector terminal to the outside, an electrode on the semiconductor chip being bonded to the lead by wire bonding, wherein the semiconductor chip and the tab are bonded to each other by a solder foil formed from a material comprising a mixture of metal particles and solder particles.
(26) A semiconductor device as described in said item (25), wherein the solder foil is a solder foil formed from a material comprising a mixture of metal particles and solder particles by rolling.
(27) A semiconductor device as described in said item (25), wherein the solder foil is a solder foil formed from a material comprising Cu particles and Sn particles by rolling.
(28) An electronic device, which comprises a circuit board and a semiconductor chip, an electrode on the circuit board and an electrode on the semiconductor chip being bonded to each other by wire bonding, wherein the circuit board and the semiconductor chip are bonded to each other by a solder foil comprising a mixture of metal particles and solder particles.
(29) An electronic device, which comprises a circuit board and a semiconductor chip, an electrode on the circuit substrate and an electrode on the semiconductor chip being bonded to each other by wire bonding, wherein the circuit board and the semiconductor chip are bonded to each other by a solder foil formed from a solder material comprising Cu particles and Sn particles by rolling.

Or, a solder foil characterized by being formed by mixing metal balls, which comprise solder-wettable simple metal, alloy, compound or their mixture, with solder balls, which comprise at least one of Sn and In, followed by pressing to fill gaps therebetween and successive rolling;

Or a solder foil formed by mixing metal balls, which comprise solder-wettable simple metal, alloy, compound or their mixture, with solder balls, which comprise at least one of Sn and In, placing the resulting mixture in advance into an easy-to-roll mold to which a uniform pressure is to be applied, and uniformly pressing the mixture to fill gaps therebetween, thereby eliminating the gaps, followed by rolling the resulting combination solder material;

Or, the above-mentioned solder foil, wherein the solder balls further contain at least one of Ag, Bi, Cu, Zn, Ni, Pd, Au, Sb, etc. in addition to Sn and In;

Or, the afore-mentioned solder foil, wherein the metal balls comprises Cu, Cu alloy, $Cu_6Sn_5$ compound, Ag, Ag—Sn compound, Au, Au—Sn compound, Al, Al—Ag compound, Al—Au compound, Zn—Al system solder or their mixtures;

Or, the afore-mentioned solder foil, wherein the rolled foil or the combination solder material is plated with a plating material comprising Sn and at least one of Bi, In, Ag, Au, Cu, Ni and Pd;

Or, the afore-mentioned solder foil, wherein the metal balls comprising the simple metal, alloy, compound or their mixture, when not wettable, are provided with a solder-wettable metallization layer such as a plating of Ni, Ni—Au, Cu, Ag, Sn, Au, or the like, or their combination plating, or a further plating of Sn system in addition thereto on the surfaces of the metal balls;

Or, the afore-mentioned solder foil, wherein the solder foil has a particle size distribution corresponding to the closest packing of the metal balls, which comprises the simple metal, alloy, compound or their mixture;

Or, the afore-mentioned solder foil, wherein the combination solder material further contains plastic balls having a solder-wettable metallization layer on the surfaces in a dispersed state to reduce the rigidity of the combination solder material;

Or, the above-mentioned solder foil, wherein the combination solder material further contains particles having a lower coefficient of thermal expansion than that of the metal balls comprising the simple metal, alloy, compound or their mixture and having a solder-wettable metallization layer on the surfaces or further a solder plating of Sn, In, etc. thereon in a dispersion state to reduce the coefficient of thermal expansion of the combination solder material;

Or, the afore-mentioned solder foil, wherein the particles having a lower coefficient of thermal expansion includes Invar alloy system (Fe-36Ni alloy), silica, alumina, AlN, SiC, etc.;

Or, the afore-mentioned solder foil, wherein materials for the plastic balls include polyimide-based resin, heat-resistant epoxy resin, silicone-based resin, various polymer beads, or their modified products or their mixtures;

Or, the afore-mentioned solder foil in the form of band, wire, ball, or block;

Or, the afore-mentioned solder foil, wherein metal fibers or copper plated fibers of carbon, glass, ceramics, etc. or a dispersion mixture of the metal balls in the metal fibers are used in place of the metal balls;

Or, the afore-mentioned solder foil, wherein cross-wise disposed assembly of metal fibers or copper-plated fibers of carbon, glass, ceramics, etc. or a dispersion mixture of the metal balls with the cross-wise disposed assembly of the fibers is used in place of the metal balls;

Or, the afore-mentioned solder foil, wherein network of metal fibers or copper-plated fibers of carbon, glass, ceramics, etc. or dispersion of the metal balls in the netting is used in place of the metal balls;

Or, the afore-mentioned solder foil, wherein the fibers have a diameter of 1-20 μm, preferably 3-15 μm;

Or, the afore-mentioned solder foil, wherein metal short fibers or copper-plated short fibers of carbon, glass, ceramics, etc. or dispersion of the metal balls in the short fibers are used in place of the metal balls;

Or, the afore-mentioned solder foil, wherein the short fibers have a diameter of 1-10 μm, preferably 1-5 μm, and an aspect ratio (length/diameter) of 2-5.

When metal balls of Cu, etc. and Sn system solder balls are mixed in a proportion of about 50% each and rolled, the Cu particles are brought into contact with each other, while Sn enters into gaps therebetween to form a combination solder. When the resulting foil is inserted between a chip and a substrate, followed by pressing and reflowing, the Cu balls themselves are linked to one another by a Cu—Sn compound at the combination solder portions, while a compound of the Cu balls with the chip electrode or a compound of the Cu balls with the substrate terminal is formed between the combination solder portions and the chip and between the combination solder portions and the substrate to produce a lead-free temperature-hierarchical bonding structure assuring a good bonding strength even at such high temperatures as 280° C. That is, a temperature-hierarchical bonding method can be provided in the lead-free solder field.

In the temperature-hierarchical bonding, the already bonded solder of high temperature side, even if partly melted but so far as the remaining portions are not melted, can keep a sufficient strength enough to withstand the successive solder bonding process. We are now making study of solder materials of dispersion mixtures of metal balls (Cu, Ag, Au, surface-treated Al, Zn—Al system solders, etc.) with solder balls. Once the bonding is established with such solder materials, even by passage through a reflow furnace (250° C. maximum) for Sn—Ag—Cu system solder as successive solder bonding the established precedent bonding can be maintained even at the set reflow furnace temperature (250° C. maximum) because of the bonding by an intermetallic compound of higher melting point ($Cu_6Sn_5$) between the Cu balls themselves, between the Cu balls and the chips and between the Cu balls and the substrate, though the Sn in the bonded portions can melt, thereby assuring the sufficient bonding strength. That is, temperature-hierarchical bonding can be attained for the Sn—Ag—Cu system solder. Effect of the intermetallic compound formation is not limited to Cu—Sn, but the same effect can be obtained with compounds of Ni—Sn ($Ni_5Sn_4$), Ag—Sn ($Ag_3Sn$), etc., and also with Au—Sn. Solders comprising In in place of Sn have the same effect. Diffusion-formed alloy layer has a high melting point, though there is a difference in growth rate of alloy layer, and never melts at 280° C., once formed.

Bonding by such solder materials remains in an incompletely restricted state of Cu balls themselves and there is some degree of freedom in the vertical and horizontal directions in case of, for example, die bonded joints. Thus, mechanical characteristics of intermediate level between Cu balls and solder balls can be expected and also thermal fatigue resistance by Sn and high reliability by prevention of crack development by Cu particles (balls) can be expected even in temperature cycle tests.

However, it has been clarified through our studies that the combination paste comprising a mixture of Cu balls and solder balls has a high probability of void formation, because the Sn system solder per se has a property of less wetting extendability on the Cu balls, though the Cu balls have many wettable portions, all the Cu balls are not completely wetted and furthermore the Cu balls and the solder balls are initially restricted by cross-linking therebetween, and when the solder balls melt, the spaces remain as voids in the melted solder ball positions. Thus, the combination paste tends to produce a large number of voids inevitably and thus may be converted to unsuitable solder materials, though dependent on desired bonding purpose. It is preferable to eliminate voids when electronic parts are to be mounted, but in the case of face-to-face bonding as in, for example, die bonding of Si chips, bonding of power module, etc. voids are structurally hard to eliminate. The remaining voids will give rise to such problems as crack development, obstruction to necessary heat diffusion, etc. due to the presence of voids.

Thus, we tried to use a solder foil prepared by placing the solder material into an easy-to-roll mold in advance, uniformly pressing, the entirety in vacuum, in a reductive atmosphere or in an inert gas atmosphere, thereby subjecting Sn system solder balls to plastic flow through between metal balls to obtain a composite molding in which gaps are filled with the solder (Sn system solder after plastic deformation), and rolling the combination molding.

It was confirmed that, for example, in the case of preparing a solder foil for die bonding Si chips from the combination molding, match balls of Cu—Cu, etc. were brought into contact with one another by pressing and an intermetallic compound was easily formed between the metal balls by die bonding to make organic linkage by the metal of high melting point entirely and assure a satisfactory strength even at 280° C. As a matter of course, the voids were compressed in vacuum and collapsed at the bonded portions, thereby enabling bonding with less voids. It was also confirmed that in the case of using a low temperature hot press in a nitrogen gas atmosphere and using Cu balls and Sn system solder balls having a larger ball diameter (about 40 μm), the Sn system solder showed a void-filling ratio of 97% or more. Furthermore, application of Sn plating of appropriate layer thickness to the foil surface could prevent materials susceptible to considerable oxidation from oxidation.

It was also confirmed that when a lap joint prepared by bonding Cu foil leads to each other by this solder was subjected to a shearing tensile test at 270° C. and a pulling speed of 50 mm/min., a test result of about 0.3 kgf/mm$^2$ showing a satisfactory strength at a high temperature was obtained.

The combination molding is to fill spaces in the material with metal balls in advance, and thus it can be expected that there are correspondingly less voids in a void ratio on the same level as or less than that of the conventional solder foil (because of the inherent structure hardly capable of forming larger voids). Thus, it has been an important task for the soldering according to the combination molding method to eliminate voids because of the inherent larger soldering area. For example, suitable lead-free materials can be provided thereby for Si die bonding, power module bonding, etc. (where "lead-free" is in the sense that any lead should not be contained intensively). That is, high temperature, lead-free materials with high reliability of temperature-hierarchical bonding, etc. can be provided thereby.

In the paste solder method, on the other hand, it has been difficult to make the solder fluxless due to the easy oxidation, but the combination molding method can solve the fluxless problem. That is, in the field where flux residues should be avoided, it has been necessary to wash the remaining, flux out after bonding by the paste solder method, and the washing has be omitted by the fluxless combination molding method.

Even in the case of hard and highly rigid solder having a desirable melting point, for example, Au-20Sn, Au-(50-55)Sn (melting point: 309°-370° C.), Au-12Ge (melting point: 356° C.), etc., they are used as metal balls and mixed with more soft, elastic rubber particles together with soft solder balls of Sn, In, etc. to make a dispersion in the metal balls, whereby the solidus temperature of the solder containing the metal balls can be kept at about 280° C. or higher, so that good bonding strength at high temperatures can be obtained, while any deformation can be lessened by soft Sn or In and rubber existing between the metal balls. Thus, a novel effect of making up for disadvantages of these hard and highly rigid solders can be expected.

Modes for carrying out the present invention will be described below.

FIG. 1 outlines step of preparing a composite metal from a combination of balls (metal balls and solder balls), where (a) shows a state of Cu balls 2 as metal balls and Sn balls 3 as solder balls provided in carbon jig 1 in a vacuum hot press, (b) shows a cross-sectional profile model of a block of a combination of the balls after plastic flow of solder by vacuum hot pressing, where Sn and Cu are deformed into a "sea-and-island structure", and (c) shows a model of rolling the block of a combination of balls by rolls 5 to form a solder foil.

In FIG. 1, Cu balls, 10-40 μm in diameter are mixed together in such a volume ratio as to make 50-60% of Cu balls. Contact area between the Cu balls can be increased by adding microfine Cu particles to the Cu balls in a closest packing ratio (refer to e.g. Shigeo Miwa: Outline of Powder Technology, page 39, published by Nikkan Kogyo Shinbun K. K. in Feb. 5, 1981). The closest packing can make a theoretical volume ratio of Cu about 74% and that of the solder 26%. So can do the microfine particles, not more than 10 μm in diameter, resulting in formation of finer network of alloy layer. This is suitable for high density fine bonding. In the case of, e.g. Cu balls, 3-8 μm in diameter and Sn balls, 10-40 μm in diameter, or in the case of Cu balls, 3-10 μm in diameter and Sn balls, 10-40 μm in diameter, or in the case of Cu balls, 5-15 μm in diameter and Sn balls, 10-40 μm in diameter, the solder packing density of foils will be decreased, but a good bonding result will be obtained. As to the diameters (sizes) of Cu balls, Sn balls, etc., all the particles are not always included in the disclosed sizes, but it is needless to say that larger or smaller balls than the disclosed sizes may be included within such a range as not to affect the effect of the invention. These balls are mixed together in a nitrogen gas atmosphere and placed in a pressure vessel comprising a carbon jig, as shown in FIG. 1(a). After evacuation, only Sn undergoes plastic deformation to fill gaps between the Cu balls by applying pressure uniformly and circumferentially to the mixture with time. Sn has a melting point of 232° C., but can be made to flow even at room temperature with prolonged time. When Sn fails to flow to every corners at room temperature, the flowing can be easily made by elevating the temperature to some degrees (100°-150° C.). So far as Cu and Sn fail to react with each other in this step, the restriction is not so high on the interface that the degree of freedom becomes higher and Sn can be more easily deformed (made to flow). The block of a combination of the balls formed by the vacuum hot press is further rolled through rolls 5 to form a solder foil. The gaps between the Cu balls are much more eliminated by rolling, so that the solder foil with much less voids can be obtained. In that case the block of a combination of the balls is directed to preparation of a solder foil having a thickness of 150 μm (±10 μm), and it is desirable to form the block of shape similar to foil shape in advance because the draft percentage can be reduced. Increase in the draft percentage will increase a contact area of Cu ball themselves and thus will intensity restriction by the increased contact area. In view of flexibility to deformation by temperature cycle, etc., it is desirable to reduce the contact area. Ultimate draft percentage is preferably not more than 20%, more preferably 15-20%.

When Cu, etc. are exposed from the solder foil so formed, it is preferable to prevent the exposed Cu, etc. from oxidation by further plating Sn to a thickness of 0.5-2 μm.

Figure 2:
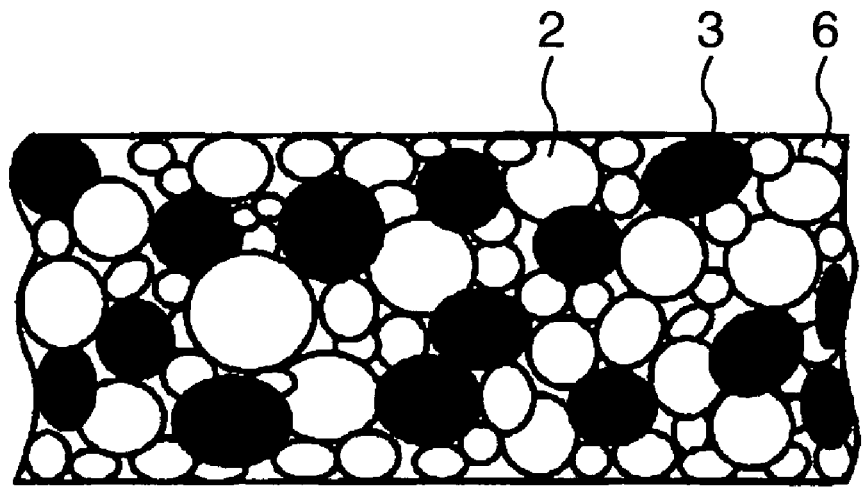
FIG. 2 is cross-sectional views of a model before and after rolling of elastomer plastic balls in a dispersion state, respectively.
Figure 2:
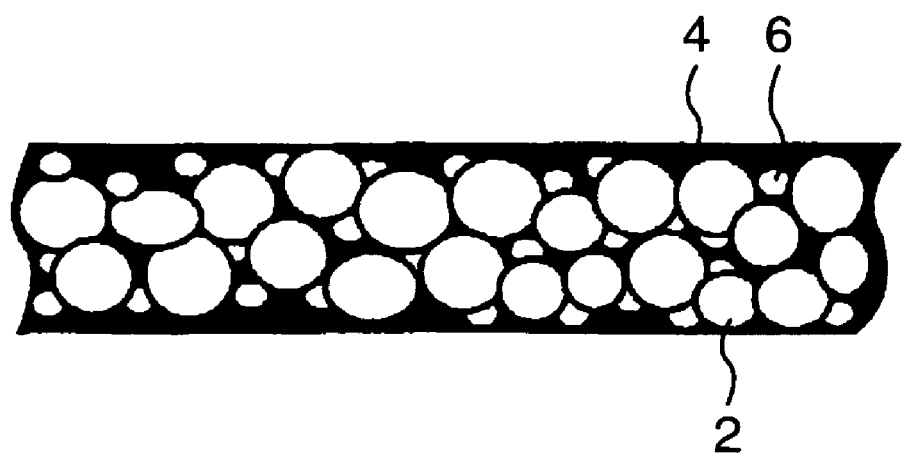

From the viewpoints of easy preparation, easy uniform dispersion at the mixing, easy handling, etc., it is preferable that the metal balls such as Cu balls and the solder balls are spherical, though the spherical shape is not always necessary. Cu balls with considerably rugged surfaces, Cu balls of bar shapes, needle shapes, fiber shapes, angular shapes or dendritic shapes may be recommended, or their combinations will be also recommended, so far as Cu members can be entangled with one another after bonding. However, when the Cu members themselves are so restricted by the compression as to lower the degree of freedom, the cushionability will be lost at the stage of soldering and bonding failure will be easy to occur. In that case, Cu balls with considerably rugged surfaces, or Cu balls of bar shapes, needle shapes, fiber shapes, angular shapes or dendritic shapes or their combinations are preferable rather than true ball shape. As shown in FIG. 2, metallized by electroless Ni plating-Au plating or electroless Ni plating-solder plating) plastic balls (rubber) 6 as a heat-resistant, soft elastomer can be further dispersed therein besides Cu balls 2 and Sn balls 3 to lower a Young's modulus, thereby assuring the cushionability. FIG. 2(*a*) shows a state before rolling and FIG. 2(*b*) shows that after rolling. The resin balls have a diameter of ideally not more than 10 μm, preferably 1 μm level, for example, desirably 0.5-5 μm. A mixing proportion even of a few % by volume of the resin balls is effective.

Two terms "particles" and "balls" are herein used as to "metal" and "solder", but these two terms are used herein substantially in the same meaning, as is clear from the foregoing description. In further distinction therebetween, the term "particles" has a rather broad sense including the term "balls".

The case of using Al as another example of metal balls will be described below.

Generally, metals of high melting points are hard, but a low cost, soft metal is pure Al. Pure Al (99.99%) is soft (Hv 17), but is usually less wettable. Thus, it is preferable to apply Ni—Au plating or Ni—Sn plating or the like to pure Al. Coating of Al surface with Au by sputtering, etc. can be recommended. It is difficult to prepare microfine particles of pure Al due to a safety problem of explosion, etc., but the safety can be assured by preparing the microfine particles in an inert gas atmosphere and successively applying Ni—Au plating to the surfaces, thereby preventing Al from contact with the atmosphere. An oxide film, even if formed on the Al particles to some extent, can be removed by a plating treatment without any problem. Furthermore, the oxide film on Al can be easily broken in the rolling step to expose fresh Al surfaces, so that bonding is not so affected thereby. The metallization layer on the Al surface is not restricted thereto, but it is necessary that after the preparation of a solder foil the solder can wet Cu, Ni, etc. to assure a sufficient bonding strength at high temperatures. Thus, it is necessary that bonding can be made between the Al particles and the Ni-plated Cu plate and between the Al particles and Ni plating on the Si chips by formation of an Sn compound with the metallization layer and Ni.

In the preparation of a block of a combination of balls, Al is liable to disperse in vacuum and particularly at high temperatures, and thus Ag-containing Sn solder is used to form a compound with Al. Besides Ag, a very small amount of Zn, Cu, Ni, Sb, etc. is added to Sn to facilitate reaction with Al, thereby making a solder for Al bonding. When a very small amount of Ag, Zn, Cu, Ni, Sb, etc. is added to Sn, it is not necessary to provide a metallization layer on the Al surface with the result of a larger merit of cost.

The Al surface can be wetted entirely or spotwise, depending on relation to the existing state of a metallization layer, that is, on whether the metallization layer is to be formed entirely or spotwise. In the case of spotwise wetting, restriction can be reduced at the stage of stress deformation, resulting in easy deformation, while the unwetted portions can absorb energy as a friction loss. Thus, solder materials with a good deformability as well as an assured bonding strength can be obtained thereby.

In place of formation of Al into a ball shape, it is possible to use other shapes, prepared by applying a plating of Sn, Ni—Sn, Au or the like to an Al wire, approximately 20-40 μm in diameter, and cutting the plated Al wire into a particulate shape or a stick shape. Al particles in a ball shape can be mass-produced at a low cost by atomization in a nitrogen gas atmosphere.

Description of Au balls will be made below.

In the preparation of a block of a combination of balls, Au balls can be easily wetted by a Sn system solder, and in the case of bonding for a short time any metallization layer is not required. In the case of prolonged soldering time, Sn diffuses so considerably that a fear of formation of a brittle Au—Sn compound arises. Thus, In plating, etc. of less Au diffusibility are useful for making a soft structure, or Ni, N—Au, etc. can be used as a barrier. Au balls can be easily deformed by making the barrier layer as thin as possible. Any other metallized structure can be used, so far as it can suppress growth of an alloy layer with Au. Diffusion can be suppressed up to the rolling step by controlling the temperature. In the case of short-time bonding by die bonding, the effect of Au flexibility can be expected without any provision of a barrier, because the alloy layer formed on the grain boundaries is very thin. A combination of Au balls and In solder balls is also available.

Description of Ag balls will be made below.

The same things as mentioned above as to Cu balls can be applied also to Ag balls, but mechanical properties of $Ag_3Sn$ compound are quite satisfactory, so that Ag particles can be bonded to one another by the compound according to the ordinary process. Ag balls can be used in mixture with Cu, etc.

Cases of using alloy materials as metal balls will be described below.

Typical examples of alloy series include Zn—Al system, Au—Sn system, etc. The Zn—Al system solders have a melting point ranging mostly from 330° to 370° C., which is in a suitable temperature range for temperature hierarchical bonding with Sn—Ag—Cu system, Sn—Ag system and Sn—Cu system solders. These alloys can be used as metal balls. Typical examples of Zn—Al system include Zn—Al—Mg, Zn—Al—Mg—Ga, Zn—Al—Ge and Zn—Al—Mg—Ge, which can further contain at least one of Sn, In, Ag, Cu, Au, Ni, etc.

However, it is pointed out that in the case of Si bonding there is a fear of Si chip cracking because Zn—Al system undergoes vigorous oxidation and the rigidity of the solder is very high, etc. (Shimizu et al: Zn—Al—Mg—Ga alloy for Pb-free solders directed to die attaching, Mate 99, 1999-2). In the case of using it as metal balls in the block of a combination of balls, these problems must be solved.

From the necessity for solving these problems, Ni-solder plated or Au-plated, heat-resistant plastic balls are uniformly mixed with and dispersed through between Sn balls and Zn—Al system balls to lower the rigidity of solder and reduce the Young's modulus. When Sn balls are mixed in a proportion of 10-50% on the basis of the entire mixture, molten Sn balls enter into the spaces between the Zn—Al system solder balls. In that case, Zn—Al balls themselves are bonded to one another to some extent, but deposited low-temperature, soft Sn—Zn phases or undissolved Sn remain in the most cases. Such Sn, Sn—Zn phases and rubber of plastic balls take part in the deformation.

In the case of actual bonding using the solder foil, the Sn can absorb deformation by a portion of Sn layer made to remain after, for example, die bonding. It can be further expected that the rigidity can be lowered by a double action of the plastic balls and the Sn layer. In that case, the solidus temperature of the Zn—Al system solder is kept at 280° C. or higher, and thus there is no problem of strength at high temperatures.

It is desirable that the plastic balls have a smaller diameter than that of Zn—Al system balls and are uniformly dispersed. When soft and elastic plastic balls of 1 μm level in diameter are deformed at the stage of deformation, remarkable effects on thermal shock damping and mechanical shock damping can be obtained. Heat-resistant plastic balls are commercially available. Since the plastic balls are substantially uniformly dispersed through between the Zn—Al system solder balls, such dispersion is mostly not broken by short-time melting at the stage of bonding. The heat-resistant resin has a thermal decomposition temperature of approximately 300° C., and thus more heat-resistant materials are desirable to use, but there is no problem in the case of short-time die bonding.

As described before, in the case of molding by the vacuum hot press, uniform pressing at a temperature incapable of melting Sn on the Sn-plated plastic balls (melting point of Sn: 232° C.) gives rise to plastic flowing, where the Zn—Al balls are seldom deformed. Spaces are uniformly filled with the plastic balls, Sn, etc. by uniform pressing, followed by rolling to a thickness of approximately 150 μm to form a solder foil. For use in die bonding, the solder foil can be coiled around a roll and supplied to a continuous process.

Zn—Al is easily oxidized, and thus in view of its storage it is desirable to apply Cu-substituted Sn plating to the surface. The Sn and Cu are dissolved into Zn—Al system solder at the stage of, for example, die bonding. The presence of Sn on the surface can facilitate bonding to Ni—Au plating on the Cu electrode. Si chip sides can be easily bonded to, for example, Ti—Ni—Au metallization layer. Since the growth rate of alloy layer of Ni and Sn ($Ni_3Sn_4$) is higher than that of Cu—Sn at temperatures of not lower than 200° C., there is no bonding failure due to insufficient formation of the compounds.

In some cases, formation of a block of a combination of Zn—Al system solder balls and plastic balls can be recommended.

Temperature-hierarchical bonding is enabled by adding to the Zn—Al system solder larger amounts of Sn and In to such a level as to assure the 280° C. level of the solidus temperature. Addition of increased amounts of Sn and In gives rise to partial formation of low strength phase of Zn—Sn eutectic alloy, etc., but the bonding strength depends on the solid phase of Zn—Al system as a skeleton, and thus there is no problem of strength at high temperatures.

By applying Cu-substituted Sn plating to the Zn—Al system solder, and elevating the temperature to the liquidus temperature of Zn—Al system solder or higher, Sn can easily extend the wetting area and dissolved into the Zn—Al system solder, while bringing thin Cu layer into solid solution. When Sn is too much (for example, about 7%), Sn fails to undergo solid solution into Zn—Al, while depositing a low-temperature Sn—Zn phase on the grain boundries. By intensive dispersion and deposition of a large number of Sn phases, the Sn—Zn phase can be allocated to deformation, whereas the Zn—Al system solid phase can be allocated to bonding strength. Thus, by applying Sn plating to the Zn—Al system solder balls and intensively allowing the Sn phase incapable of undergoing solid solution into the balls to remain, deformation can be absorbed by the Sn layer to lower the rigidity of Zn—Al. That is, the rigidity of the solder at the bonded portions can be lowered and the bonding failure can be made less.

Figure 3:
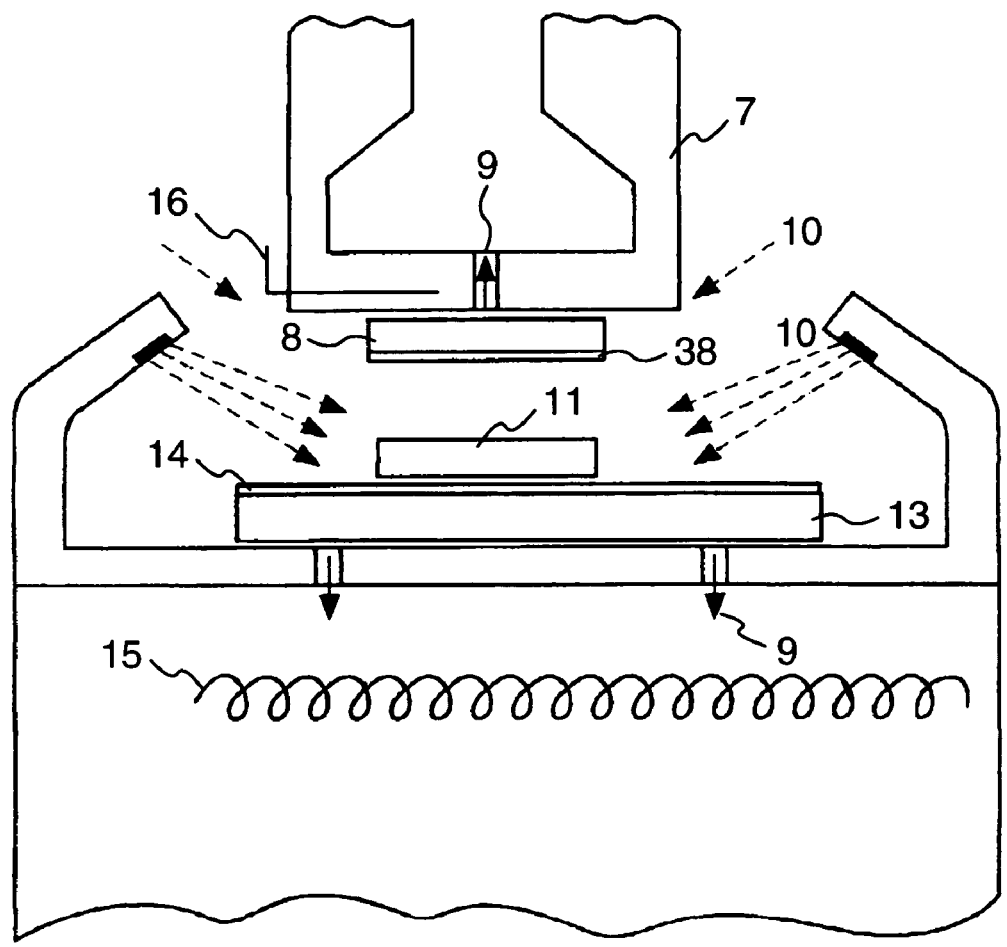
FIG. 3 is a cross-sectional view of a model according to one embodiment of die bonding process.

FIG. 3 shows one embodiment of die bonding Si chip 8 to W—Cu plating metallization layer 14 (Ni plating will do in place of the W—Cu plating) on $Al_2O_3$ substrate 13, using the aforementioned solder foil 11. A typical example of solder foil 11 is a combination of Cu as metal balls and Sn as a solder. Cu is relatively soft and very reactive with Sn, and the mechanical properties of the intermetallic compound ($Cu_6Sn_5$) are so distinguished that brittleness is hard to come out even if the compound grows thickly. Even if the growth of the compound is considerable to show an adverse effect, it is possible to retard the growth rate of the alloy layer by adding a very small amount of Cu or the like to Sn. It is also possible to suppress the growth of the alloy layer by applying a thin Ni plating of Ni, Ni—Au or the like to Cu, where it is important that the Cu balls are surely linked to one another by the intermetallic compound at the stage of short-time soldering, and also it is desirable to actively conduct the reaction. Thus, excess growth is no problem. It is rather important in the bonding between Sn and the chip and between Sn and the substrate to improve the wettability and wetting extendability of Sn. Thus, effects of flowability improvement by addition of a very small amount of Cu and Bi to Sn and wettability improvement by reduction in the surface tension can be expected. Furthermore, an effect by addition of a very small amount of Ni, Ag, Zn etc. can be also expected due to the improvement of the strength on the boundaries. Replacement of Sn with Sn—Sb (5-10%) can contribute to an improvement of the melting point of Sn, and Sb concentration of the solder can be increased by formation of Cu—Sb compound and Ni—Sn compound, whereby the melting point of the solder can be increased to 246° C.

Pure Al balls further softer than Cu as another typical example has a distinguished temperature cycle deformability. Reaction between Al balls and a chip or a metallization layer on the substrate is a problem. By applying Ni plating or Ni—Au flash plating to the Al surface, good bonding strength by Sn can be likewise assured between the Al balls themselves, between the Al balls and Ni-plated chip or Ni-plated substrate. Intermetallic compound between Ni and Sn is usually $Ni_3Sn_4$, which has a higher growth rate than that of Cu—Sn at 200° C. or higher, and thus there is no fear of insufficient reaction. Where Cu and Ni are present together, an alloy layer containing $(NiCu)_3Sn_4$ can be partly formed sometimes. To allow the solder to react directly with Al balls, a very small amount of Ag, Ni, Zn, Ti, etc. is added to Sn, whereby bonding between the Al balls themselves can be also obtained, depending on bonding conditions.

The same steps can be also taken toward Au balls. Au is soft and can easily form a compound with Sn, and thus can provide a useful composition apart from the cost side. However, compound of Sn-rich system have low melting points. To obtain a melting point of 280° C. or higher, it is necessary to make compounds of AuSn and $AuSn_2$ in a Sn composition ratio of not more than 55% Sn. Thus, it is necessary to make the bonded portion Sn-poor by elevating the soldering temperature. Formation of Au—Sn and AuSn can be easily made by providing, for example, Cr—Ni—Sn metallization layer on the Si chip side. In view of cost reduction, etc., it is possible to mix Au balls with Cu balls, Al balls, Ag balls or the like.

Ag balls are likewise a strong candidate, and can provide unmeltable linked bonding even at 280° C. by formation of an $Ag_3Sn$ compound having a high melting point.

An application example to Zn—Al system hard balls having a low melting point will be given below. Zn—Al system is generally settled down to an Al range of 3-5% from the viewpoint of melting point and brittleness, and furthermore Mg, Ge, Ga or the like is added thereto to lower the melting point and furthermore Sn or In is added thereto to lower the solidus temperature. Sometimes, Cu, Ag, Ni or the like is added thereto to secure better wettability and strength. Their melting points are on a level of 280°-360° C. For example, in the case of Zn-4Al-2Mg-1Ag-10Sn, when Sn balls are mixed therewith as solder balls, a portion of Sn will undergo solid solution into the Zn—Al system balls even if these two are melted, while the most portions remain as Sn. In that case, excess Sn, In or the like, which fails to underdo solid solution in the solder can be dispersed into the solder in an isolated state by thorough dispersion in a particulate state, and thus similar effect can be expected. Application of thick Sn plating to the Zn—Al system balls is one of solutions for dispersing Sn in an isolated state.

In the case of Zn—Al system balls, the entirety is melted at the stage of soldering, and thus the surface shape made by the action of surface tension can characteristically take a natural shape. Zn—Al system also undergoes vigorous surface oxidation, and thus it is necessary to take a step for preventing oxidation, the step including preheating. When used as a foil, oxidation can be effectively prevented by applying Cu (0-0.2 μm thick)-Sn (1 μm thick) plating to the surface. By making Sn present between the Zn—Al system balls themselves, Sn can play a roll of a buffering agent against temperature cycle deformation, but in an unsatisfactory case, microfine Sn plated plastic balls (rubber) are mixed therewith to make their dispersion, whereby deformability and shock resistance can be further improved and also the Young's modulus can be lowered together with an improvement of thermal fatigue resistance.

An—Sn system, etc. are likewise available as hard alloy series of low melting point, for which the same steps can be taken.

An electrode with W (sintered)-Cu plating (3 μm thick) (or W—Ni plating) 14 is formed on $Al_2O_3$ substrate 13 to be used. Besides, mullite, glass ceramic, AlN, etc. are also available as a ceramic substrate. When a flux is used at the stage of bonding, simple Cu electrode can be used as such, if an inert gas atmosphere or a reductive atmosphere is available at the initial preheating stage and thereafter.

Si chip 8 to be used has a size of 5 mm □, and solder foil 11 has a size of 4 mm □×0.15 mm thick, but there is no restriction to the chip size. That is, a larger-size chip can be used.

Against secondary reflowing at the post step, the compound layer can assure good strength at high temperatures, and Sn system solder can mostly act on the successively occurring thermal fatigue, while partially elastically bonded portions can exert a maximum effect on stresswise severe portions (though unbearable portions will be broken). Thus, the life can be improved, as compared with the case without any elastic bonding. Thus, the compound must be partly formed into a network in the solder, far from such an image as strongly constrained by the compound layer. By forming the compound at the bonding boundaries on the chip periphery subject to large strains and stresses, breakage is hard to take place due to strong bonding. On the other hand, when the solder foil in the same peripheral position has less network bonds in the center level position, the stresses and strains are shifted from the outermost peripheral position onto the center level position of the solder foil, thereby lessening the stresses on the upside and downside boundary positions.

At first, $Al_2O_3$ substrate 13 is fixed onto a frame base by vacuum suction, while Si chip 8 is also held on resistance heater tool 7 serving also as a mounting jig by vacuum suction 9. Si chip 8 is brought into contact with $Al_2O_3$ substrate 13 through solder foil 11 by descending resistance heater tool 7 and kept to heating (maximum 380° C.) and pressing (initially 2 kgf) for 5 seconds. Thermocouple 16 for temperature measurement is embedded in the tool at a position near the contact between the tool and the chip to conduct temperature control.

When the temperature of solder foil 11 reaches the melting point, Sn, etc. of the solder foil melt immediately, and pressing force is applied to the bonding between the metal balls themselves to start melting. To prevent crushing of bonding between the metal balls, resistance heating tool 7 is made to move, upon reaching a set temperature, from the position of pressing solder foil 11 as a starting point to a position of not more than about 10% (maximum 20%) of the solder foil thickness, thereby controlling an amount of the solder extruded from the chip. The thickness of the solder foil affects thermal fatigue life, and thus usually it is 80-150 μm. The solder foil thickness and solder foil dimension relative to the chip dimension serve to control a crushing rate of solder foil. In the present system, inclusion of Cu to a half and also its network linkage can ensure distinguished thermal conduction, and thus even a solder foil thickness of 200-250 μm is thermally distinguished, as compared with the conventional system.

Preheating 15 of $Al_2O_3$ substrate is set to about 100° C. Abrupt temperature increase or decrease gives a large stress on the joints, and thus preheating is important also in the sense of damping a thermal shock.

In the case of die bonding by a resistance heater, a mechanism of locally injecting nitrogen 10 from circumferential positions is used to prevent oxidation of solder foil 11 at the stage of bonding. Nitrogen 10 is injected also to the circumference of resistance heater tool 7 onto which Si chip 8 is attached by suction, where maintenance of the bonding portions at an oxygen purity on a level of 50-100 ppm can be recommended.

Such a solder foil can fulfil die bonding of Si chip etc. or also bonding of power module, etc. at about 270° C. maximum in a hydrogen furnace or a furnace in an inert gas atmosphere such as nitrogen gas, etc. In the case of using the furnace, bonding can be carried out at a maximum temperature of 260°-350° C. for Sn, but conditions must be selected in view of the compound formation state.

Figure 4:
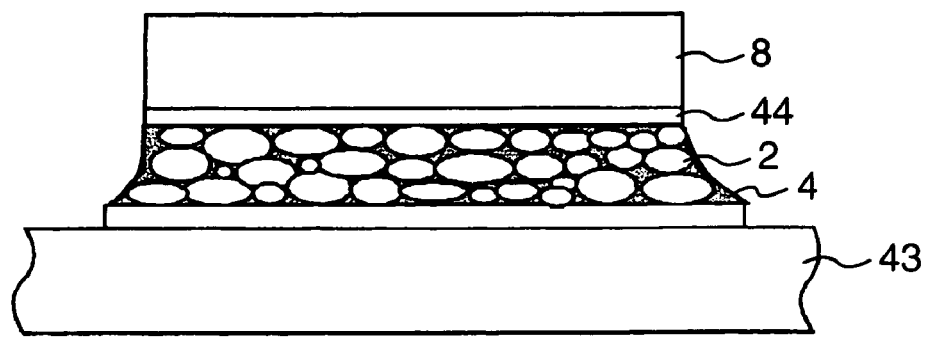
FIG. 4 is a cross-sectional view of model showing a die bonded joint by using a solder foil comprising Cu and Sn in combination.

FIG. 4 shows a cross-sectional view of a model of typical bonded portion by die bonding with a resistance heater or in a hydrogen furnace or a furnace in an inert gas atmosphere such as nitrogen gas, etc. Upside surface of the chip so die bonded is linked to the substrate terminal by wire bonding, etc., followed by cap sealing the chip or resin sealing, and further by bonding small-sized parts, etc. to the substrate circumference (in this case a solder foil matched to the thermal and provisionally fixed to electrodes, etc. on chip parts in advance can be bonded to the substrate, or the foil thermally compression bonded thereto can be bonded to the substrate in a reflow furnace), and external connection terminals are provided (usually by bonding with a solder of Sn-3Ag-0.5Cu, etc.) on the backside, etc. of the substrate to complete a module.

Alloy layers are firmly formed between Cu balls 2 themselves, between Cu balls and metallization layer 44 on the chip side (for example, Cr—Ni—Au:Au is very thin, and thus substantially an alloy layer is formed between Cu—Sn—Ni), and between Cu balls and metallization layer 12 on the substrate side (for example, Ni plating on Ag—Pd conductor; formation of an alloy layer between Cu—Sn—Ni), respectively to maintain a firmly linked state. Combinations of the metallization layer on the chip side are various, and those which react with Sn of the solder are mostly Cu or Ni. Sometimes, Au is used in the surface layer mostly to prevent oxidation, but Au undergoes solid solution into Sn on a level of not more than 0.1 μm and thus takes no part in the alloy layer formation. The substrate side surface, on the other hand, is also various, and a reactive layer with Sn consists of Ni or Cu as in the case of chips. In special cases, thick film conductors of Ag, Ag—Pt, Ag—Pd, Au—Pd, etc. are available. In the bonding of power module, the presence of voids considerably affects thermal conduction characteristics, and thus it is most important to eliminate voids. In the case of a solder paste, a large amount of gas is generated by reaction with a flux, evaporation of solvents, etc., and thus the solder paste is applied to die bonding of joint structures capable of easily discharging gases, such as long and slender terminals, small-sized Si chips, etc. That is, in the die bonding of medium or large-sized Si chips, die bonding by a resistance heater using a solder foil in an inert gas atmosphere without any flux or die bonding in a hydrogen furnace or in a furnace in an inert gas atmosphere such as nitrogen, etc. is commonly used. Voids involved in the solder foil prepared according to the present invention has such a tendency that voids will increase with decreasing Cu particle size, but the voids will be dispersed structurally more finely than the particle size and are far from the image of large voids so far observed. It can be expected that voids have less influence on the characteristics. In the case of using Cu particles and Sn particles, both having particles of 3-8 μm, the solder foil has a solder filling ratio of about 80% (void ratio 20%). When the foil was sandwiched between Sn-plated Cu plates and subjected to die bonding in a nitrogen gas atmosphere by a die bonder, an intermetallic compound of $Cu_6Sn_5$ was formed firmly between the Cu balls and the Cu plates, and excess Sn was absorbed into microspaces (voids) in the solder. It was found that sufficiently bonded portions could be obtained. From the results of cross-sectional investigation it was confirmed that the solder filing ratio in the foil was improved after bonding, as compared with the ratio before bonding. It was found therefrom that the conventional void problem was substantially negligible in the present system. When Cu particle size is reduced to a 3 μm level or less, bonding must be carried out at high soldering temperatures, such as 300° C. or higher, or when the retention time at high temperatures is prolonged, the Cu particle shape will be collapsed due to the vigorous reaction with Sn, and Cu—Sn compound may serve to conduct linkage, while such characteristics as high temperature strength, etc. per se undergo no change thereby. Particularly to suppress the reaction, chemical Ni/Au plating, etc. can be applied (where the compound is hard to form thickly even at high temperatures) or Ag particles, etc. can be also used. When Cu particles are coarse such as 30 μm level, the void ratio is not more than 3% in a dispersed state of voids, which seem to have no influence on the characteristics.

The solder foil prepared in the steps described in the foregoing embodiments can be coiled around a reel and can be supplied continuously to the successive process steps including a cutting step. In the case of using it in bonding of the sealing portions and terminal connection portions of necessary parts for the temperature-hierarchical bonding, the solder-foil matched to the desired shape by punching, laser processing, etc. can be used. The sealing portions and terminal connection portions of the parts are heated and pressed in a nitrogen gas atmosphere by a pulse type, pressing heating tool to conduct bonding without any flux. To prevent oxidation at the stage of preheating and assure good wettability, Sn-plated solder foil is desirable. In the case of bonding parts of a few terminals provided at a coarse pitch, etc., bonding can be easily carried out due to easy disposition of solder foil, easy positioning of terminals of the parts, and easy compression bonding by resistance heating electrode with a pulse current.

Figure 5:
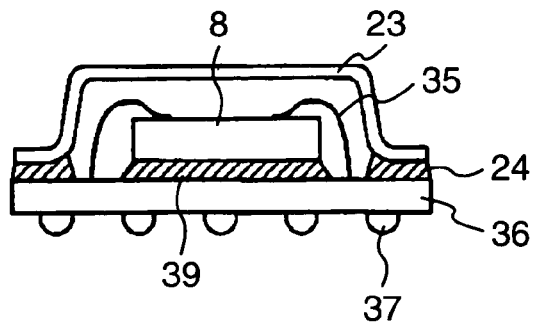
FIG. 5 is cross-sectional views of a model of bonding LSI and cap to a substrate.
Figure 5:
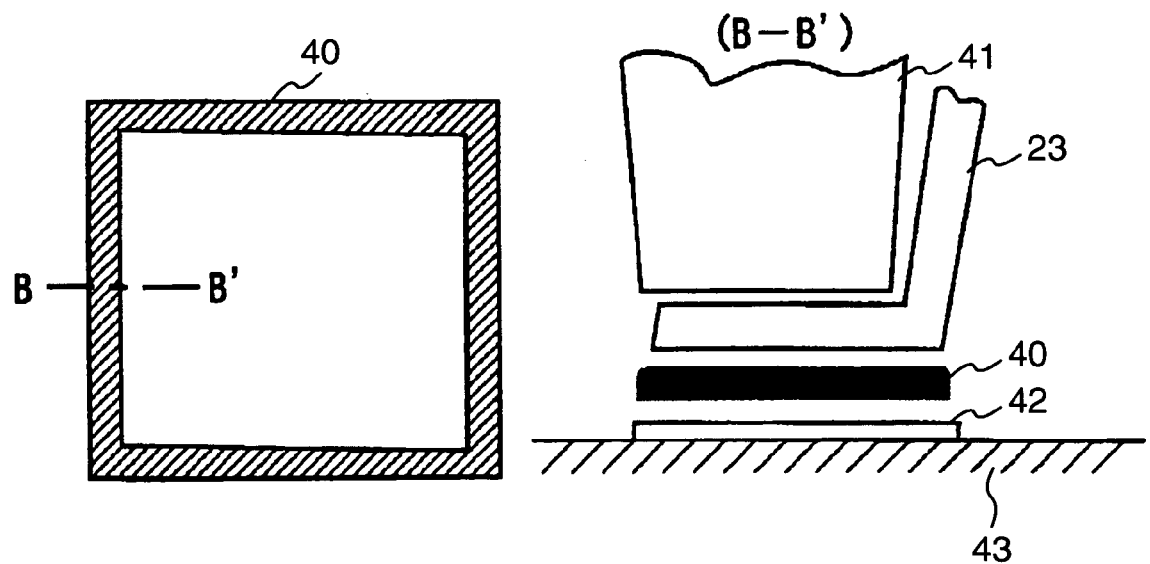
Figure 5:
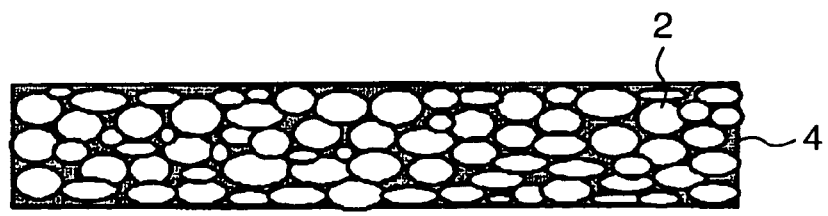

FIG. 5(a) shows a cross-sectional view of BGA or CSP type chip carrier where solder foil 39 as shown in FIG. 5(c) and described above is placed between chip 8 and interposer substrate 36 and subjected to die bonding in a nitrogen gas atmosphere by a resistance heater by pulse heating without any flux, and terminals on the chip is linked to terminals on interposer substrate 36 by wire bonding 35 of Au wire, while a solder foil is placed between cap 23 of Ni-plated Al, etc. and interposer substrate 36 and subjected to sealing therebetween in a nitrogen gas atmosphere by a resistance heater without any flux. The solder foil can be subjected to bonding upon provisional fixing to the member to be bonded. Interposer substrate 36 is brought into a vertical electrical connection through throughholes not shown in the drawing, that is, electrical connection of chip 8 to external connection terminals. This structure is a typical example of the ordinary module structure, and chip parts such as resistors, condensers, etc. can be mounted on interposer substrate 3, though not shown in the drawing. In the case of chips of high power output, an AlN interposer substrate of distinguished thermal conductivity is preferably used from the viewpoint of heat radiation efficiency. Solder composition for the external connection terminals of the module is Sn-3Ag-0.5Cu, and can be supplied in the form of balls in the case of broad pitches, but formed into a paste in the case of narrow pitches. Then, the module is mounted onto a printed circuit board and subjected to reflow bonding together with other parts at the same time at 240° C. maximum by Sn-3Ag-0.5Cu solder (melting point: 217°-221° C.). As described before, bonding of the solder foil itself can be maintained at the reflow temperature, and thus the bonding to the printed circuit board can be made with high reliability. That is, temperature-hierarchical bonding can be obtained in the bonding in the case of module packaging and also in the bonding onto the printed circuit board. Though the form of external connection terminals is various, temperature-hierarchical bonding can be anyway attained in the bonding of external connection terminals to the printed circuit board by using a solder foil. Needless to say, this structure is also applicable to the so called BGA type semiconductor device, in which a semiconductor chip is bonded to a substrate by die bonding with a solder foil, terminals on the semiconductor chip are bonded to terminals on the substrate by wire bonding, and solder balls acting as external connection terminals are formed on the backside of the substrate. In that case, resin molding is applied to the chip-to-be-mounted side. To improve the wettability of the outer circumferences of the bonded portions, the chip carrier is subjected to reflowing in a nitrogen gas furnace, a hydrogen furnace or the like after the bonding by a resistance heater by pulse heating, whereby good joints can be formed.

FIG. 5(b) shows an embodiment of sealing in the structure shown in FIG. 5(a) where Ni-plated Al fin 23 is sealed in a nitrogen gas atmosphere to interposer substrate 43 with a foil placed thereon by a resistance heater without any flux.

Left view of FIG. 5(b) shows punched solder foil 40 comprising Cu balls and Sn balls, and right view of FIG. 5(b) shows a cross-sectional view of a model of sealing solder foil 40 (cross-section along line B-B' of the left view) and Ni-plated Al fin 23 to terminals (Ni—Au flash 42) on the interposer substrate by heating in a nitrogen gas atmosphere by resistance heater press 41 by pulse heating. After bonding in the state shown in the right view of FIG. 5(b), the shape of bonded portion 24 in FIG. 5(a) can be obtained. The solder foil used is as shown in FIG. 5(c) and as so far described above.

Reflow bonding without any flux in a furnace in a reductive atmosphere using a hydrogen gas, etc. is available. In the case of using rosin-based flux assuring a long-term insulation, there is no corrosion problem, and thus washing-free reflow bonding is also available, depending on products.

In the case of using metal balls having a high melting point, the key to the reflowing is to bring out a state of solder foil in contact with the side to be bonded so as to facilitate diffusion bonding on both sides of the solder foil, and thus compression contacting is preferable. That is, a process including a provisional fixing step or a pressing step is preferably used. For example, it is preferable to supply a solder foil fixed to electrode portions of leads and parts by compression bonding in advance. All the Zn—Al system are of melting type and thus have no such fear.

Figure 6:
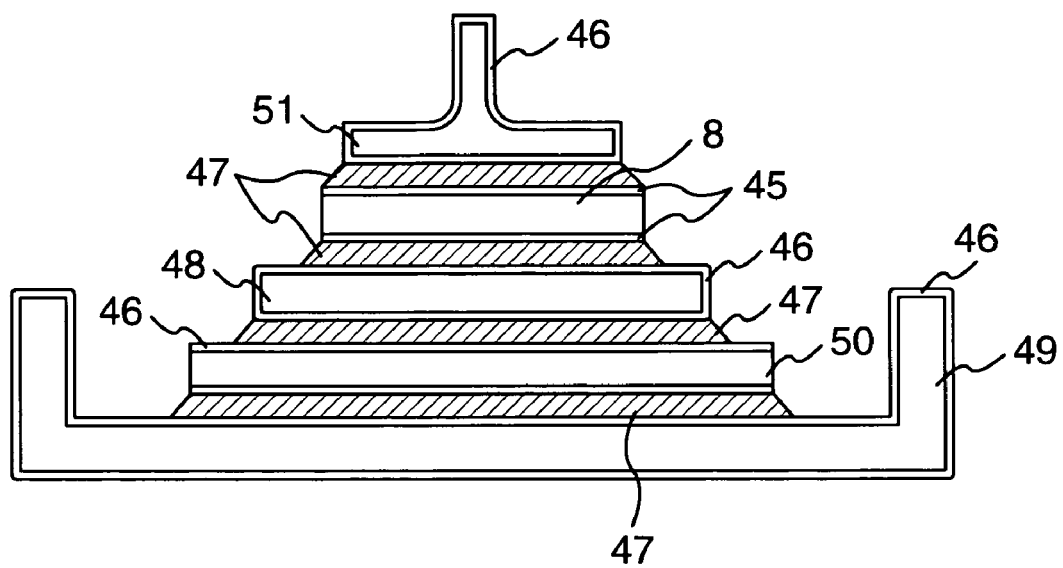
FIG. 6 is a cross-sectional view of power module.

FIG. 6 shows an embodiment of application to power module bonding. In most cases, Si chip 8 has a dimension of 10 mm □ level, and thus soft, Pb-rich, high temperature system have been so far used. On the other hand, Pb-free solders include, for example, Sn-3.5Ag (221° C.), Sn-0.7Cu (227° C.) and Sn-5Sb (235° C.). In view of the fact that Sb has an environmental load problem, only Sn-3.5Ag and Sn-0.7Cu are available in the current situation. Zn—Al system are hard and have a high possibility to cause Si chip cracking as each.

In that case, Pb-5Sn system solders have been so far used, because even the conventional solders such as Sn-5Sb system, etc. have failed to assure the reliability due to high temperature heat generation, far from the original function of high temperature solder for temperature-hierarchical bonding. No Pb-free, soft solders are available yet as a substitute for the high Pb content solder, and thus the present solder foil can be used for this purpose as a substitute. The 230° C. level state, which is rarely encountered in vehicles, is specified for vehicle solders as requirements, and requirements for withstanding reflowing at 260° C. is specified for the vehicle solders. In the case of the composite solders, Sn melts at the stage of reflowing at 260° C., whereas network linkage is maintained by the intermetallic compound to assure good strength at high temperatures. In vehicles, etc. having chances of exposing to high temperature on a 220° C. level, Sn-(5-7)% Sb solder (melting point: 236-243° C.) balls are used as Sn system solders to prevent instantaneous partial melting, whereby the Sb concentration reaches 10% or more by reaction between the Sn balls and Cu balls and reaction between Sn and substrate terminals (Cu and Ni) to elevate the lower limit temperature to a 245° C. level, which is higher than the melting point of Sn (232° C.). That is, a fear of partial melting at 220° C. can be eliminated. Shearing strength at 280° C. of the present bonding system can be kept at 1N/mm$^2$ or more.

Different from Sn—Pb eutectic mixture, it is said that Sn—Ag—Cu system, on the other hand, has a high strength, a high rigidity and a poor deformability, and thus has an adverse effect on devices, parts, etc. Soft solders of Sn—In system, Sn—Cu—In system, Sn—(0-1)Ag—Cu, Sn-(0-1) Ag—Cu—In system, etc. themselves can correspond to deformation, though melting points of the solders are somewhat decreased to a 200° C. level, and thus it can be expected that they can be used as temperature-hierarchical solders for packaging of shock resistance-requiring portable appliances. As a matter of course, the necessary strength for the stage of second soldering can be obtained as a high temperature strength by linkage of compounds with network Cu, and particularly at the outermost circumference of chips, parts, etc. subject to maximum stress and strain, formation of such a network as to prevent breakage near the boundaries but break within the solder by formation of compounds with Cu balls is desirable.

For this purpose, a solder foil comprising Cu balls and Sn balls is used. That is, soft Cu balls, 10-30 μm in diameter, and Sn balls, 10-30 μm in diameter, are mixed together in a ratio of approximately 1:1 by weight, and Sn is made to undergo plastic flow between the Cu balls in vacuum or in a reductive atmosphere, followed by rolling to prepare a solder foil. Alternatively, soft Cu balls, 3-8 μm in diameter, are mixed together in a ratio of approximately 1:1 and Sn is made to undergo plastic flow between Cu balls in vacuum or in a reductive atmosphere, followed by rolling to prepare a solder foil. The solder foil is cut to the necessary dimensions and the cut solder foils are inserted between Ni-plated Cu lead 51 and Si chip 8, between Si chip 8 and Cu disk plate (or Mo disk plate) 48 with Ni plating 46, between Cu disk plate 48 and alumina insulation substrate 50 with Ni plating 49 on W metallization layer, and between said alumina insulation substrate 50 and Cu base plate 49 with Ni electrolplating 46, respectively, and subjected all together to reflow bonding in a hydrogen furnace at 280° C., whereby bonding can be made by intermetallic compounds of Cu or Ni between Cu balls, between Cu balls and Cu lead, between Cu balls and chips, between Cu balls and Ni-plated Cu plates, between Cu balls and Ni-plated alumina insulation substrate, between Cu balls and Ni-plated Cu base, etc. The resulting joints are linked by high temperature-resistant intermetallic compounds ($Cu_6Sn_5$ in the case of Cu and $Ni_3Sn_4$ in the case of Ni), and thus good strength can be maintained at 260° C. (satisfactory even at 260°-280° C.) without any reflow problem in the successive steps. It has been confirmed by temperature cycle tests and power cycle tests that the resulting joints have an equivalent duration to that of the conventional Pb-rich solder.

Furthermore, dispersion of rubber of Sn-plated plastic balls can lower the Young's modulus, thereby much more improving the thermal shock resistance, and enabling bonding of much large-sized Si chips. Packaging can be made by compression bonding at 350° C. for 5 seconds (5-10 seconds are satisfactory) while injecting nitrogen through a pulse-heating type die bonder. Wetting at the outer circumference of chips can be maintained and bonding on the bonded boundaries can be assured by provisional fixing by pulse heating to make sure of contacting at the boundaries and then by reflowing in a hydrogen furnace in bulk. It is desirable to form smooth fillets at the chip circumference, and thus a layer of only Sn can be provided at the outer circumference of solder foil.

When a rolled solder foil comprising a mixture in dispersion of balls of Sn, In, or the like in place of the Cu balls, and solder balls of Zn—Al system (Zn—Al—Mg, Zn—Al—Ge, Zn—Al—Mg—Ge, Zn—Al—Mg—Ga, etc.), and further rubber of Sn-plated plastic balls is used, temperature cycle resistance and shock resistance can be likewise lessened with high relaibility can be obtained. Single Zn—Al system solder is hard (Hv approximately 120-160) and has a high rigidity, and thus large-sized Si chips have a fear of easy breakage. Thus, by providing a soft, low-temperature resistant layer of Sn or In partly at the peripheries of the balls or dispersing the rubber around the balls, a deformability can be effectively brought about to lower the rigidity and increase the relaibility.

By adding Ni-plated or Ni—Au-plated particles of low thermal expansion filler ($SiO_2$, AlN, Invar alloy, etc.) thereto, the coefficient of thermal expansion can be made to approach that of Si, etc., whereby the working stress can be made lower and prolonged duration can be expected.

Figure 7:
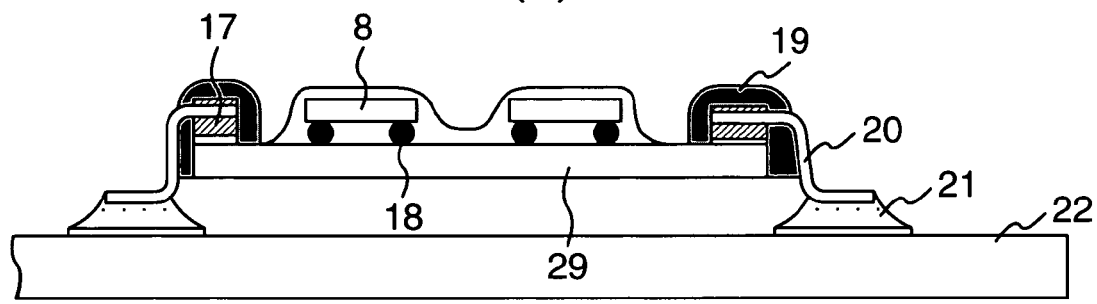
FIG. 7 is cross-sectional views of a model of mounting modules onto a printed circuit board.
Figure 7:
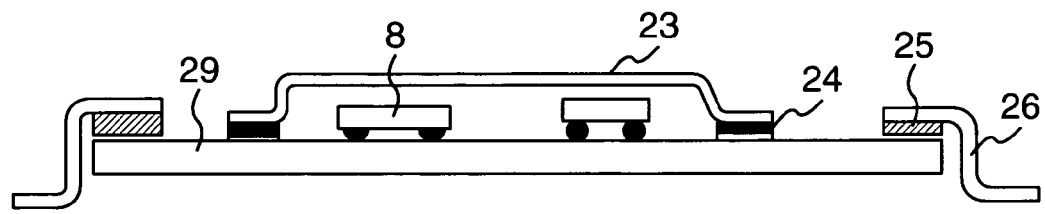
Figure 7:
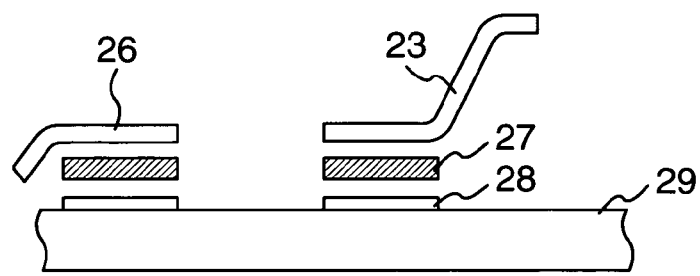
Figure 7:
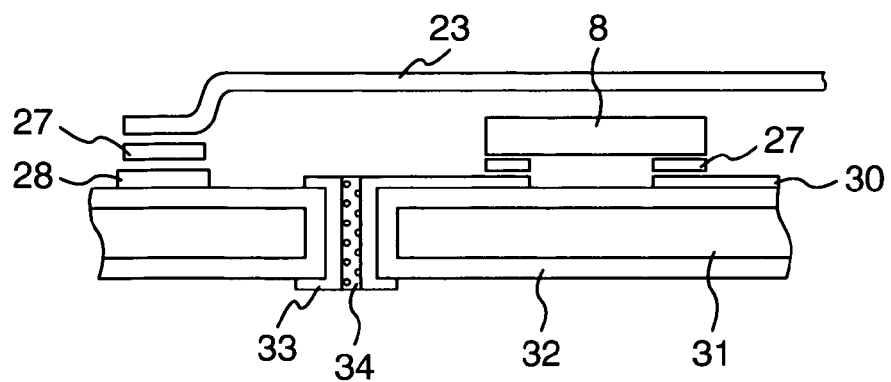

FIG. 7 shows embodiments of mounting an RF (radio frequency) module for high frequency for use in signal processing of portable telephones, etc.

Generally, a method of die bonding the backside of a device to an interposer substrate having a distinguished thermal conduction, followed by wire bonding to the terminal portions of the interposer substrate is suitable for such a type of mode. In many cases, chip parts such as R, C, etc. are provided on several chips and their surrounding, followed by MCM (multichip module) formation. Conventional HIC (hybrid IC), power MOSIC, etc. are typical cases. Module substrates include, for example, Si thin film substrate, AlN substrates with a low coefficient of thermal expansion and high thermal conduction, glass ceramic substrates with a low coefficient of thermal expansion, $Al_2O_3$ substrates with a coefficient of thermal expansion near that of GaAs, metallic core polymer substrates of Invar alloy, etc. with a high thermal resistance and improved thermal conduction, etc.

FIG. 7(a) shows an embodiment of mounting Si chips 8 on Si module substrate 29. R, C, etc. can be formed as thin films on Si module substrate 29, thereby enabling much higher density mounting, and only Si chips 8 can be mounted mostly as flip chips. Mounting on printed circuit board 22 can be carried out through QFP-LSI type, soft Cu-based leads 20. Bonding between leads 20 and Si module substrate 29 can be carried out by compression heating, using cut solder foils 17 of the present invention. Then, final protection and reinforcement are carried out with soft resin 19 such as silicone, etc. Solder bumps 18 for Si chips are made of Sn-3Ag (melting point: 221° C.) and bonded to interposer substrate 29. Bonding to printed circuit board 22 is carried out with Sn—Ag—Cu system, Pb-free solder 21. Solder bumps 18, even if remelted at the stage of reflowing of Sn—Ag—Cu system, Pb-free solder 21, hardly undergo any change by the weight of Si chips 8 at the stage of mounting onto printed circuit substrate 22 and also have no stress burden by virtue of Si—Si bonds without any reliability problem. After the mounting on printed circuit substrate 22, Si chips 8 can be coated with silicone gel 12, etc. for protection purpose.

Alternatively, when Au ball bumps are used in place of solder bumps 18 for Si chips 8 and Sn plating is applied to terminals formed on interposer substrate 29, Au—Sn bond can be obtained by compression heat bonding without melting at a reflow temperature of 250° C. at the stage of mounting on printed circuit substrate 22. Thus, temperature-hierarchical bonding can be obtained and bonding can fully withstand reflowing.

In the bonding with solder foil 17, good bonding by the intermetallic compounds formed between metal balls of Cu, etc. are maintained, as already described before, and good strength can be assured even at a reflow temperature of 250° C. at the stage of mounting on printed circuit board 22, whereby temperature-hierarchical lead-free bonding, which has been so far an important task, can be obtained.

When such thick film substrates as AlN substrates, glass ceramic substrates, $Al_2O_3$ substrates, etc. are used in place of Si substrates, mounting of chip parts such as R, C, etc. are required for making functional devices. On the other hands, R and C can be formed by laser trimming of thick film paste. In the case of forming R and C from the thick film paste, the same mounting method as for the Si substrates can be used.

FIG. 7(b) shows an embodiment of insulation sealing a module using GaAs chips 8 and $Al_2O_3$ module substrate 29 with distinguished thermal conduction and mechanical characteristics with a case of Al fin 23. Since GaAs and $Al_2O_3$ have nearly equal coefficients of thermal expansion, flip chip mounting has no reliability problem. Bonding of these chip parts to the terminal is carried out by provisionally fixing a solder foil with a thickness t: 0.05-0.10 onto devices and chip parts with a small number of terminals, if the terminal area is 0.6 mm □ or more, or by provisionally fixing it to the terminals on the substrate, followed by individually subjecting to compression bonding in a nitrogen gas atmosphere by a resistance heater or reflowing in a reductive atmosphere or in an inert gas atmopshere. A solder foil with a thickness t: 0.15-0.25 can be also used. To correspond to high power output, generally the solder foil of the present invention is used for chip mounting (chip backside 8) and subjected to die bonding, whereas terminals are subjected to wire bonding.

In the case of Al fin bonding, a solder foil in such a shape as to surround the circumference of the fin is used and subjected to compression bonding in a nitrogen gas atmosphere by a resistance heater. Left side of FIG. 7(c) is an example of terminal bonding, whereas right side thereof is an example of bonding of Al fin 23, where solder foil 27 is inserted between terminal 28 of module substrate and lead or terminal of the fin bonding portion, followed by bonding in both examples. In that case, it is preferable that the solder foil is provisionally fixed either to the substrate side or to the fin side. In the case of Al, Ni plating, etc. are applied to the terminal portion.

FIG. 7(d) shows a step model of mounting C such as Invar alloy, etc. onto organic substrate 32. When a polymer substrate of metal core polyimide resin with low thermal expansion and distinguished heat resistance, etc., a build-up substrate corresponding to high density mounting, etc. are used for heat-generating chips GaAs chips can be directly mounted thereon. In the case of highly heat-generating chips, dummy terminals can be provided to conduct heat directly to metal.

RF modules have been described above as an application embodiment to the device of the present invention, but application to SAW (elastic surface wave) device structures used as a band pass filter for various mobile telecommunication equipment, PA (high frequency power amplifier) modules, other modules and devices can be likewise made. Product field covers not only portable telephones, note-type personal computers, etc. but also module-mounted appliances applicable to new household electrical appliances, etc. in the degitalization age.

Figure 8:
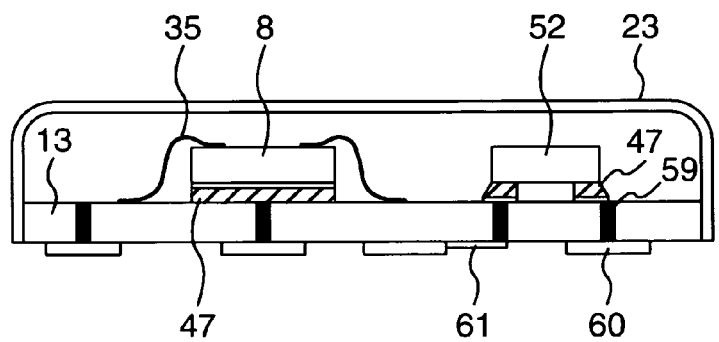
FIG. 8 is cross-sectional views of a model of mounting RF module.
Figure 8:
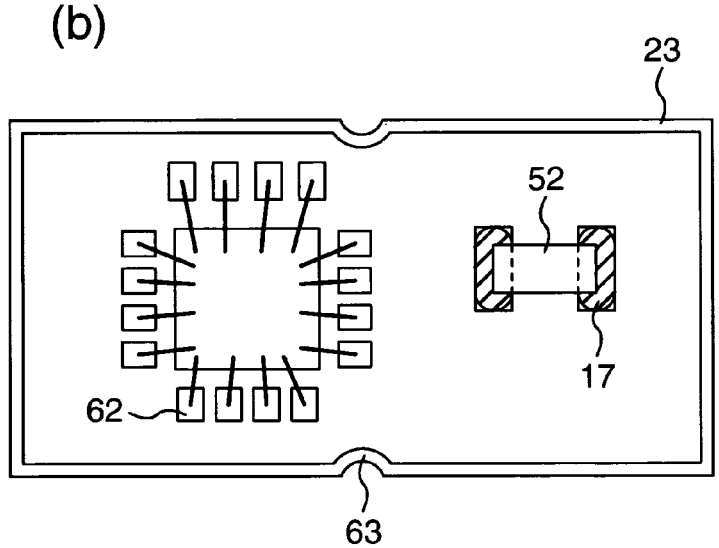
Figure 8:
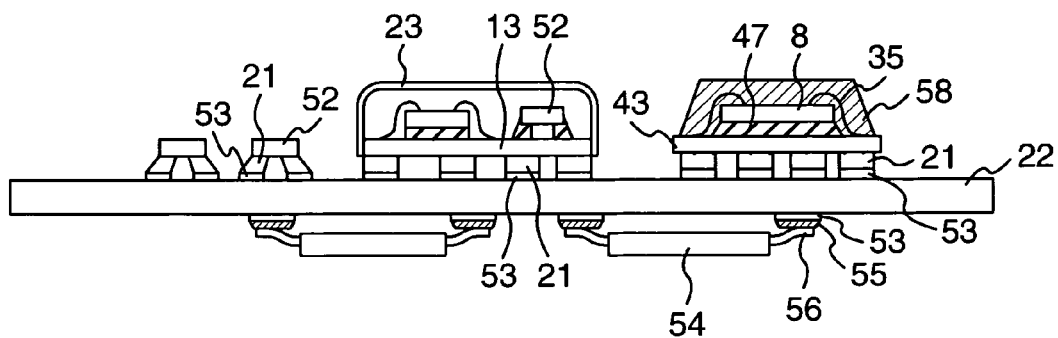

FIG. 8 shows further application embodiments to RF module mounting, where FIG. 8(a) is a cross-sectional view of the module and FIG. 8(b) shows a plan view of the upper side thereof upon taking member 23 away therefrom. In the actual structure, several MOSFET devices of chip 8, about 2 mm □, capable of generating radio wave are mounted by bonding in a face-up manner to correspond to conversion to the multiband, and furthermore a high frequency circuit capable of efficiently generating radio wave is formed in the surrounding position by R or C chip part 52, etc. Chip parts are downsized, and 1005, etc. can be used, so that the longitudinal and lateral dimensions of the module is approximately 7×14 with high density mounting. In view of only the functional side of solder, an example of a model with only one device and one chip part as mounted is typically shown. As will be given later, chip 8 and chip part 52 are solder bonded onto $Al_2O_3$ substrate 13. Terminal of chip 8 is connected to an electrode on $Al_2O_3$ substrate 13 by wire bonding, and furthermore electrically connected to thick film electrode 60 serving as an outer connector on the backside of the substrate through throughhole 59 and thick film conductor 61. Chip part 52 is solder bonded to an electrode on the substrate 13 and furthermore electrically connected to the thick film electrode 60 serving as an external connector on the backside of the substrate through throughhole 59 and wiring 61. Though not shown in the drawings, electrode 62 on the substrate and throughhole 59, which are connected to the chip or chip part, are electrically connected to each other by wiring. Member (Al fin) 23 covering the entire modules and $Al_2O_3$ substrate 13 are joined together by caulking, etc. The present module can be packaged by solder bonding to thick film electrode 60 serving as an external connector to a printed circuit board, etc., where temperature-hierarchical bonding is required.

Figure 9:
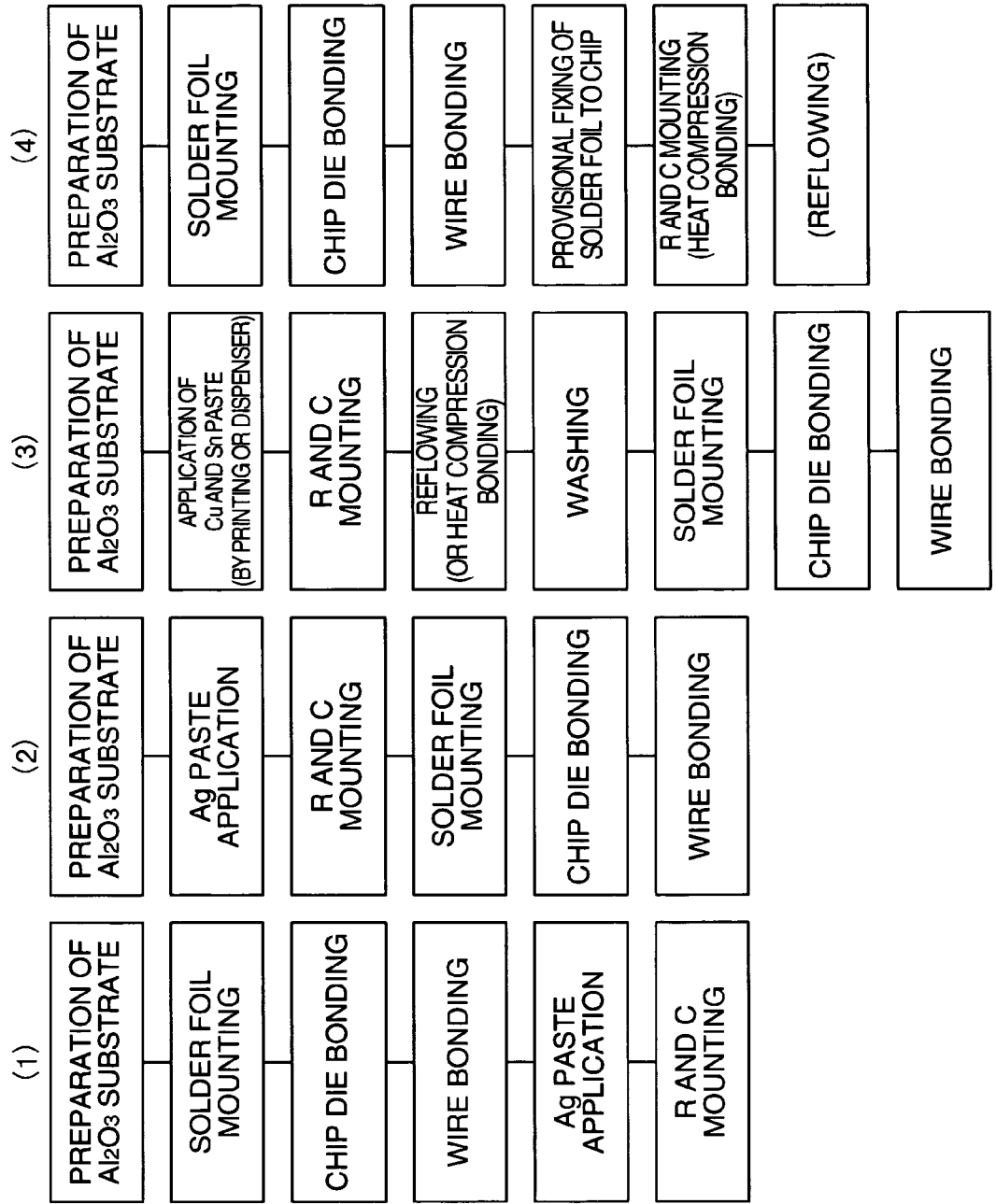
FIG. 9 is process flow charts each showing a process for mounting an RF module.

FIG. 9 is flow charts showing 4 processes on the basis of die bonding of Si (or GaAs) chip, using a solder foil in the structure shown in FIG. 8. Processes (1) and (2) are systems of selecting the conventional Ag paste for small-sized R or C chip parts such as 1005, etc. from the viewpoint of workability, where process (1) is a system of die bonding with a solder foil in a nitrogen gas atmosphere for a short time without any flux in a clean substrate surface state, followed by wire bonding and bonding of chip parts by an Ag paste, whereas process (2) is a system of bonding chip parts by an Ag paste of first, where a furnace, when used for resin hardening, will foul the substrate surface, leading to a fear of adverse effect on wire bonding in the successive steps, and thus in that case washing must be carried out before wire bonding. Process (3) is a system of supplying a mixed paste of metal balls and solder balls with distinguished workability to small-sized chip parts to assure likewise temperature-hierarchical bonding on the high temperature side, though the principle of joining is the same as in the case of solder foil, where supply of the mixed paste can be made by printing or by a dispenser. Washing must be carried out after reflowing, and since extreme void elimination is required for high power output Si chips, die bonding of chips is carried out with a solder foil suitable for the void elimination, followed by the final wire bonding. When die bonding and wire bonding are carried out at first in process (3), step of flux washing can be omitted. Process (4) is a system of die bonding and wire bonding at first, which involves two plans for the poststep. One plan is to bond chip parts one by one in a nitrogen gas atmosphere without any flux in the poststep, but this plan takes a long time as a disadvantage. The other plan is to bond chip parts with a flux on a provisional fixing level, followed by reflow bonding in bulk. More particularly, after die bonding and wire bonding, it is preferable that a composite solder foil comprising, for example, Zu balls and Sn balls, with approximately 1 μm-thick Sn plating on the surface (in almost all cases, chip parts are Ni-plated, and in these cases Sn plating is unnecessary) is cut to substantially the electrode dimension and a provisionally fixed to the electrode portion of the parts by compression heating (where a flux may be used), and the solder-foil provisionally fixed parts are provisionally fixed to the W—Ni—Au plated electrode portion on the $Al_2O_3$ substrate by heat compression bonding to such a degree as to undergo plastic deformation. When the individual parts are pressed one by one at 300°-350° C. for 5 seconds in a nitrogen atmosphere by a pulse-type resistance heater, intermetallic compounds are surely formed to serve to attain linkage. Needless to say, satisfactory strength even at high temperatures of 260° C. or higher can be maintained. By passing through a reflow furnace (270°-320° C. maximum), the compression bonded portions, Cu and Ni together can undergo linkage by the alloy layer. Complete linkage is not necessary. Partial linkage has no problem at high temperatures even though the strength is low.

Small-sized chip parts are not so elevated to high temperatures as the devices are, but in the case that deterioration of Ag paste is a problem when used for a long time, high reliability can be assured by using a solder as the essential component of the present composition. Only a problem is a time-consuming one in surely fixing small-sized chip parts by heat pressure bonding one by one.

FIG. 8(*c*) shows one embodiment of solder bonding of the aforementioned module to printed circuit board 22, where besides the module, electronic parts 52 and BAG type semiconductor devices are also solder bonded. Semiconductors are provided by bonding semiconductor chip 8 onto interposer substrate 43 in a face-up manner by the aforementioned solder foil, and bonding the terminal of semiconductor chip 8 to the terminal on interposer substrate 43 by wire bonding 35, while the surroundings are resin sealed with resin 58. Solder ball bumps 21 are formed on the underside of interposer substrate 43. For solder ball bumps 21, a solder of, for example, Sn-2.5Ag-0.5Cu is used. Sn-(1-2.5)Ag-0.5Cu is desirable for solder ball 30. For example, Sn-1.0Ag-0.5Cu can be used. Electronic parts are also solder bonded to the backside of the interposer substrate as an example of so called "both side mounting".

According to one mode of mounting, for example, a Sn-3Ag-0.5Cu solder (melting point: 2170°-221° C.) paste is printed onto the electrode portion on a printed circuit board at first. Then, to conduct solder bonding from the mounting side of electronic part 54, electronic part 50 is mounted thereon and solder bonding can be attained by reflow bonding at 240° C. maximum. Then, electronic part, module and semiconductor device are mounted and reflow bonded at 240° C. maximum to attain both-side mounting. In this manner, heat-resistant, light parts are reflow bonded at first, and then less heat resistant, heavy parts are bonded as a general rule. In the case of reflow bonding afterwards, it is desirable not to remelt the solder on the initially bonded side.

As already described before, bonding of solder foil itself used is bonding within the module can be maintained at a reflowing temperature at the stage of mounting onto the printed circuit board in that case, and thus modules and semiconductor devices can be bonded to the printed circuit board with high reliability. That is, temperature-hierarchical bonding can be attained between the bonding of semiconductor devices or bonding within the modules and the bonding onto the printed circuit board. In the foregoing embodiment, bonding onto both sides of the printed circuit board is made by the same solder, but in the case of weight-negligible, small-sized parts such as 1005, etc. as electronic parts 54, even if the solder melts at the stage of reflow bonding of electronic parts, modules and semiconductor devices, the small-sized parts never fall off because the small-sized parts themselves are of high weight, and the action of surface tension is superior to the gravity. Thus, even bonding only by Sn without any formation of intermetallic compounds with the terminals on the board, as in the worst case, will be no problem. In view of the productivity, a solder paste comprising a mixture of Cu and Sn is preferred for small-sized parts mounted within the module to the provisional fixing of a solder foil comprising a mixture of Cu and Sn.

Figure 10:
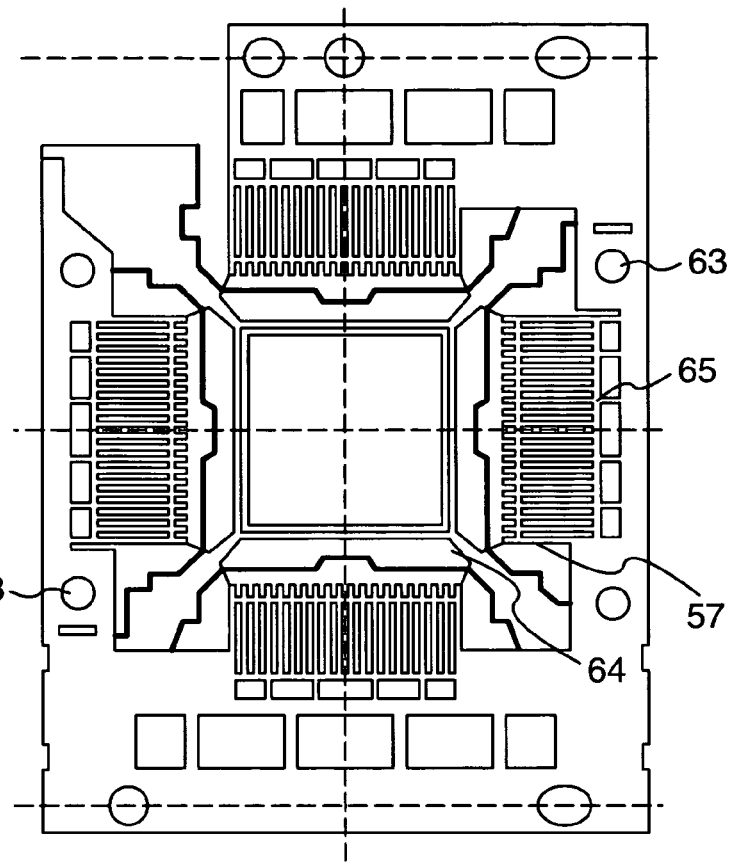
FIG. 10 is a plan view of a high power output resin package and cross-sectional views of models thereof.
Figure 10:
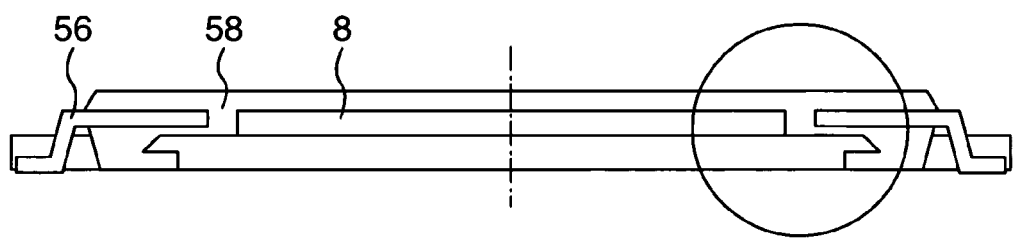
Figure 10:
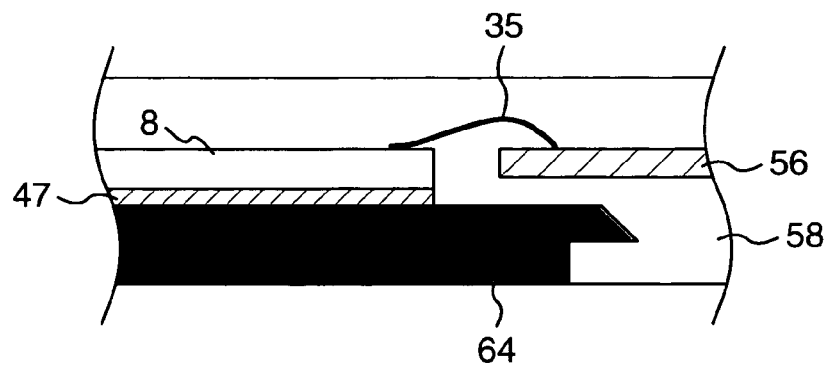

An application embodiment to resin package of high power output chips such as motor drive IC, etc. will be given below. FIG. 10(a) is a plan view showing joining of lead frame 65 to heat diffusion plate 64 face-to-face by caulking, where caulking positions 63 are two. FIG. 10(b) is a cross-sectional view of a package and FIG. 10(c) is a partially enlarged view thereof. Heat from heat-generating chip 8 on a 3 W level is conducted to heat diffusion plate (Cu-based composite material of low thermal expansion) as a leader through solder 47. Lead material is composed of, for example, 42 alloy series materials.

Figure 11:
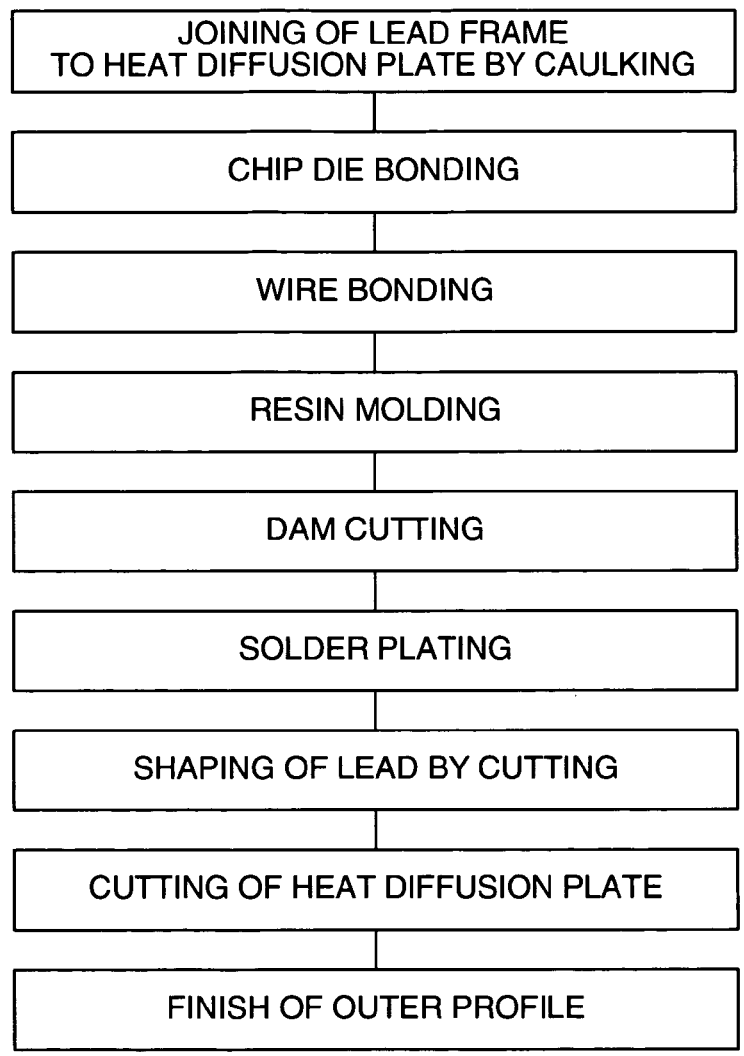
FIG. 11 is a flow chart showing a process for making a high power output resin package.

FIG. 11 shows a flow diagram of packaging process. At first, a lead frame and a heat diffusion plate (heat sink) are joined together by caulking. Then, semiconductor chip 8 is die bonded onto heat diffusion plate 64 joined by caulking through solder and dam 57. Die-bonded semiconductor chip 8 is wire bonded to lead 56 by gold wire 35, etc., as shown in the drawing, followed by resin molding, dam cutting and application of Sn-based solder. Then, the lead is shaped by cutting and the heat diffusion plate is cut to finish the outer profile. The electrode on the backside of Si chip 8 can be a commonly used metallization layer of Cr—Ni—Au, Cr—Cu—Au, Ti—Pt—Au, Ti—Ni—Au, etc. In the case that Au is rich, formation of an Au-rich compound of Au—Sn having a higher melting point can be recommended. Die bonding of the chip was carried out at 350° C. under an initial compression of 2 kgf for 5 seconds by a pulse type, resistance heater, while injecting a nitrogen gas thereto, where control of solder film thickness was carried out by setting a position by 10 μm downward from the initial compression position (film thickness: 70 μm) according to a system of mechanismwise maintaining the film thickness to improve the thermal fatigue resistance. Besides the above chip die bonding conditions, the chip die bonding was also carried out at 350° C. under an initial compression of 1 kgf for 5-10 seconds, where, even if control of the solder film thickness was set to a position by 10 μm downward from the initial compression position (film thickness: 150 μm), the same results was obtained. Reduction in void ratio was important because of the high power output chip, and not more than 5% as a target was attained. The solder contains Cu balls in a uniformly dispersed state, and thus larger voids are structurally hard to generate. Against severe thermal fatigue, Sn and Sn-based solder themselves have a distinguished thermal fatigue resistance and also have a distinguished deformability. Furthermore, intermetallic compounds are formed networkwise between the Cu particles and between the Cu particles and the electrode, and thus good strength can be maintained even at high temperatures of 260° C. or higher. When the bonds between the Cu particles, etc. are too strong (alloy layers are much more formed on boundaries between the Cu particles, etc.), the Cu balls, etc. are restricted to lose the degree of freedom, resulting in strong elastic bonds. Thus, such bonds are not good for devices, etc. There must be appropriate bonds. Particularly, in the chip peripheral region, the conventional solder is broken in a position near the stress-concentrated bonding boundaries, but is hardly broken within the solder. In the case of present solder, breakage is hard to take place at the boundaries due to reaction between the bonding boundaries and the Cu balls, whereas breakable network is formed within the solder. After die bonding and wire bonding, resin molding is conducted and the dam is cut. Then, Pb-free solder plating of Sn—Bi, Sn—Ag, or Sn—Cu system is applied to the lead to a thickness of 2-8 μm. Then, the lead is shaped by cutting, and unwanted parts are cut off from the heat diffusion plate to finish the outer profile.

Figure 12:
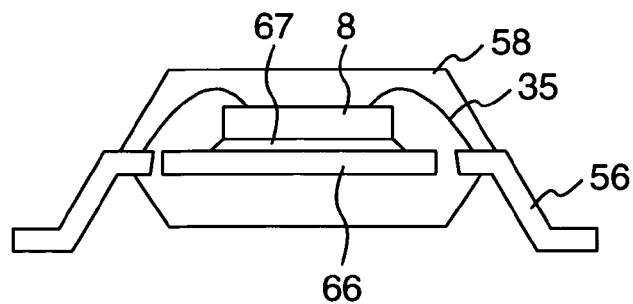
FIG. 12 is a cross-sectional view of a model of plastic package.

FIG. 12 shows an application embodiment to an ordinary plastic package. Backside of Si chip is bonded to tab 66 of 42 Alloy by electroconductive paste 67. Device is linked to lead 56 by wire bonding 35 and molded by resin 58. Then, Sn—Bi system plating, which can meet the Pb-free requirements, is applied to the lead. Heretofore, Sn-37Pb eutectic solder having a melting point of 183° C. has been used for mounting onto a printed circuit board, and thus reflow bonding at 220° C. maximum has been available. To meet the Pb-free requirements, reflow bonding must be carried out with Sn-3Ag-0.5Cu (melting point: 217°-221° C.), and thus the maximum temperature is 240° C., which is by about 20° C. higher than the conventional maximum temperature. Thus, when the conventional heat-resistant electroconductive paste or adhesive is used for bonding between Si chip 8 and tab 66 of 42 Alloy, the bonding strength is lowered at high temperatures and adverse effects on the subsequent reliability are highly expectable. Use of the present solder foil in place of the electroconductive paste can assure good strength at high temperatures of 270°-350° C. maximum, and thus the temperature-hierarchical bonding by a Pb-free solder can be attained. The application to a plastic package can be applied to all the plastic package structures of bonding Si chips to tabs. Gull-Wing type, Flap type, J-Lead type, Butt-Lead type and Leadless type are structurally available.

Figure 13:
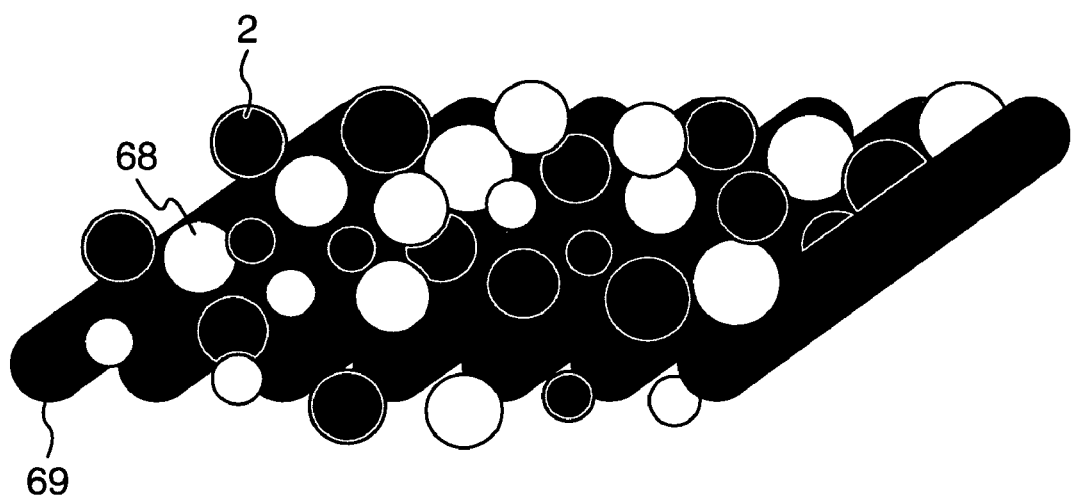
FIG. 13 is a perspective view and a cross-sectional view of a model of a combination with metal fibers.
Figure 13:
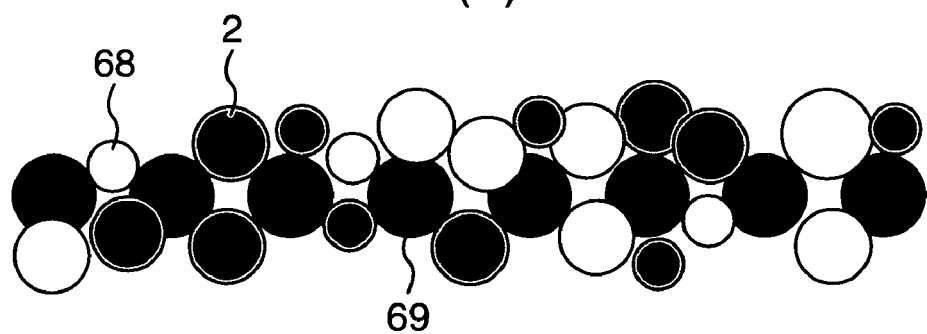

FIG. 13 shows one embodiment of model structure at the stage before formation of a composite solder foil. Sn-plated metal fibers 69 of Cu, etc. in diameters on a 3-15 μm level (surface treatment with Ni/Au, etc. may be carried out to suppress reaction between Cu and Sn in the case of shaping and molding at high temperatures) are arranged in parallel with one another, and a mixture of solder balls of Sn, etc. and metal balls of Sn-plated Cu, etc. in an appropriate proportion (about 50%) is placed thereon, followed by shaping and rolling to form a foil with a thickness on a 150-250 μm level. To lower the Young's modulus, Sn-plated, heat-resistant plastic balls, or Cu/Sn-plated silica of low thermal expansion, Invar alloy, etc. as a substitute for some portions of the metal balls may be added thereto. By shaping and rolling, the soft solder balls enters into gaps between the metal balls and metal fibers to form the sea in the "sea-and-island structure". The metal fibers are not limited to said diameter of 3-15 μm, and serve as nuclei on the center level of the foil, whereas the metal balls play an important roll on the bonding boundaries with members to be bonded. In the continuous rolling, the metal fibers are oriented in the rolling direction to facilitate the rolling work. In place of the metal fibers, Cu (or Cu/solder)-plated carbon fibers capable of conversion to finer filaments and lower thermal expansion, Ni/Au, Ni/solder or Cu (or Cu/solder)-plated fibers of ceramics, glass, Invar alloy, etc. are available.

Figure 14:
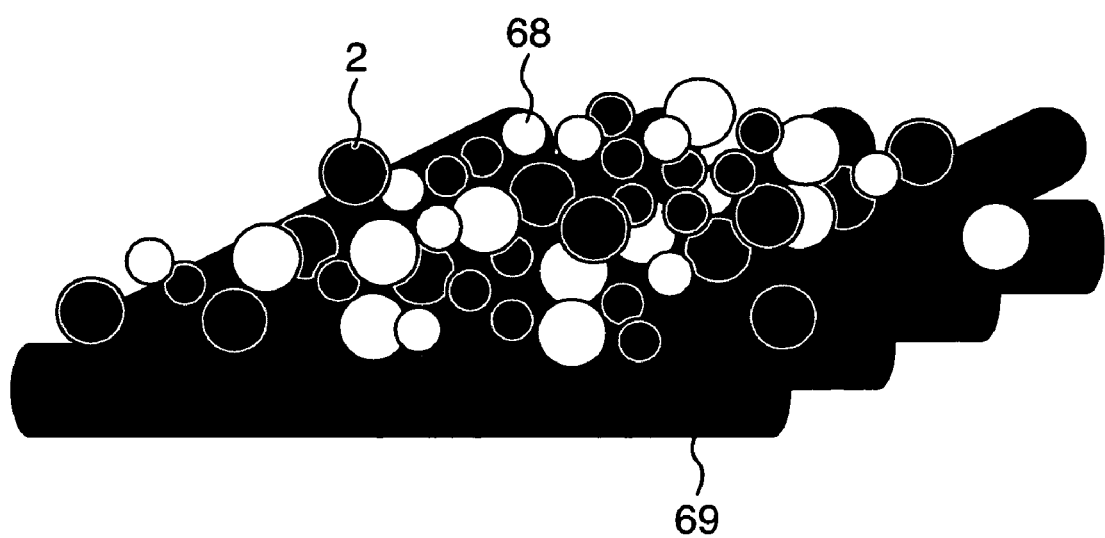
FIG. 14 is a perspective view of a model with crossed metal fibers.

FIG. 13 shows an embodiment of parallel arrangement of metal fibers serving as nuclei of the solder foil, whereas FIG. 14 shows a stable structure of crossed arrangement of metal fibers (where crossing angle is as desired). A mixture of solder balls of Sn, etc. and metal balls of Sn-plated Cu, etc. in an appropriate proportion (about 50%) enters into gaps between the crossed metal fibers. Similar modifications to those as in FIG. 13 are available.

Figure 15:
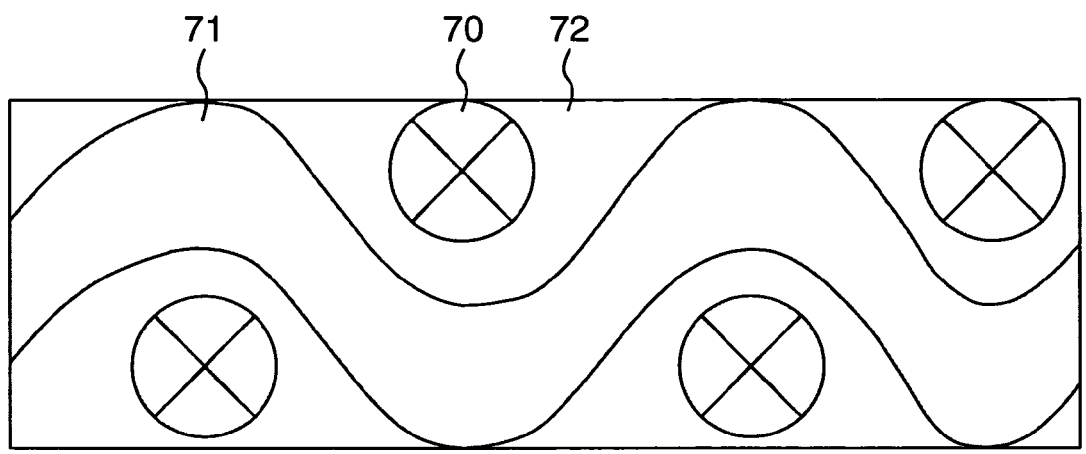
FIG. 15 is cross-sectional views of a model with network fibers.
Figure 15:
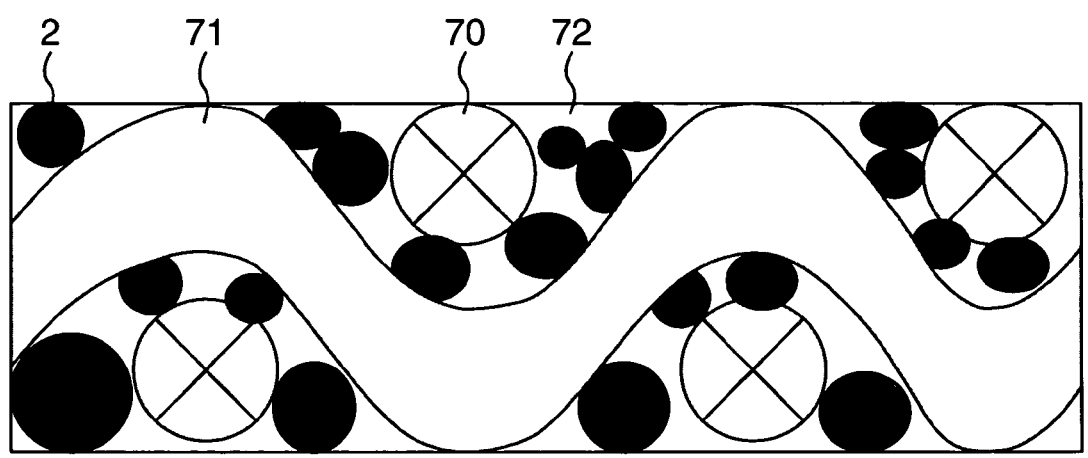

FIG. 15 are cross-sectional views of foils where network metal fibers 71 are used. Cross-sections of network metal fibers extended backwards are shown by mark "x" 70 in the drawing. FIG. 15(a) shows a solder foil composed of network metal fibers and a solder. Reduction in network mesh sizes is limited, and the minimum mesh size of the currently commercially available network metal fibers is 325, particle size through which particles can pass is as large as 44 μm, and also the sizes of metal fibers, which form the network, are large, so that the contact area at the bonding boundaries is small (area for compound formation). Thus, maintenance of good strength at high temperatures is a problem. Thus, a mixture of solder balls of Sn, etc. and metal balls 2 of Sn-plated Cu, etc. in an appropriate proportion (about 50%) is filled in gaps between the networks 70 and 71 to form a solder foil, whose cross-sectional view is shown in FIG. 15(b). Solder 72 is in such a structure as filled in the gaps. When maintenance of good strength at high temperature is required, the Cu balls are mixed in a somewhat larger proportion to concentrate on compound formation at the bonding boundaries with member to be bonded. In the case of making much of thermal fatigue of joints, the solder is mixed in a somewhat larger proportion to enable control of concentrating on thermal fatigue resistance of the solder. The metal balls to be filled are not limited to ball form, but fiber form, etc. as will be mentioned below, are also available. Mixing proportion of metal balls to solder depends on form, contact state, etc. of metal, and is much variable.

Figure 16:
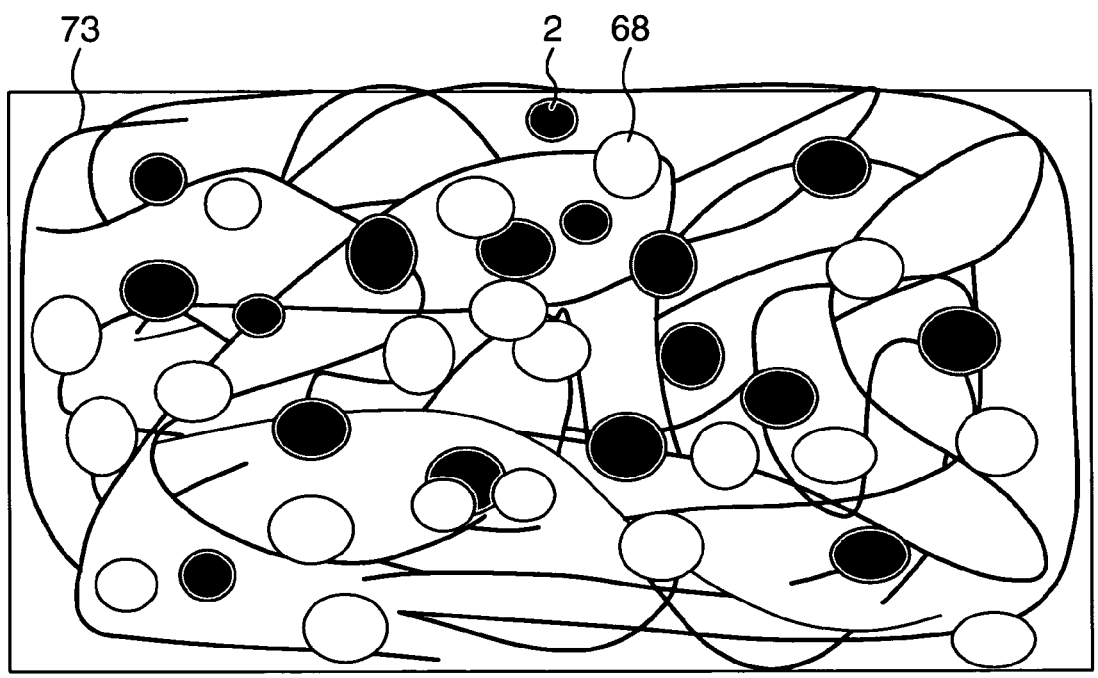
FIG. 16 is a plan view and a cross-sectional view showing long and slender fibers disposed at random, followed by flattening.
Figure 16:
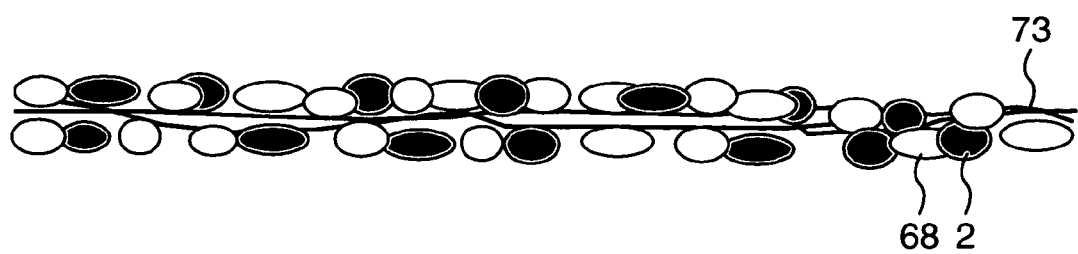

FIG. 16 shows a model of such a state, where long and slender metal fibers 73 are flattened at random to make a frame, as in making paper, and a mixture of solder balls 68 of Sn, etc. and metal balls 2 of Sn-plated Cu, etc. in an appropriate proportion (about 50%) is spread on both sides of the frame to fill the gaps in the frame. FIG. 16(a) is a plan view thereof, and FIG. 16(b) is a cross-sectional view thereof.

Figure 17:
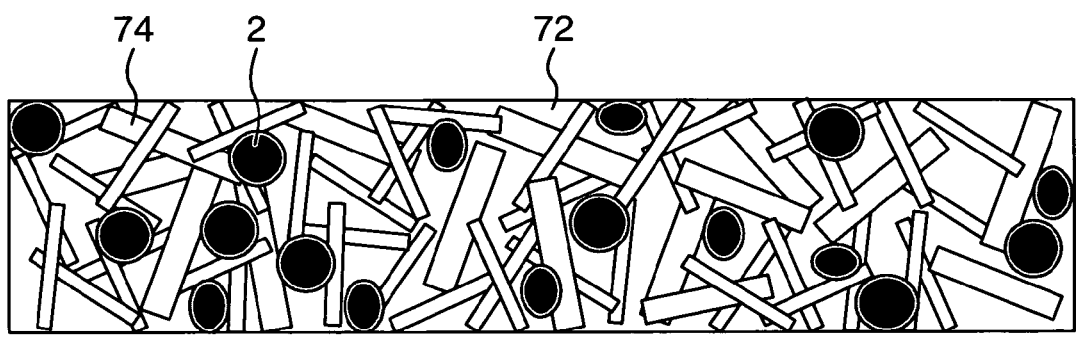
FIG. 17 is a cross-sectional view of a model with oblong metal fibers and non-metal fibers.

FIG. 17 shows use of oblong metal fibers or Cu (or Cu/solder)-plated oblong carbon fibers capable of conversion to low thermal expansion, or Ni/Au, Ni/solder or Cu (or Cu/solder)-plated oblong fibers of ceramics, glass, Invar alloy, etc. in place of the metal balls. Use of oblong fibers can considerably increase the mixing proportion of solder. Metal balls can be filled into the gaps between the oblong fibers to intensity networks by compound formation. The structure is restricted only by metal balls and becomes rigid, but by dispersion of oblong fibers in this manner a structure with distinguished deformability and elasticity can be expected, and it seems that good performance at the stage of die bonding or against thermal fatigue can be obtained. The length of oblong fibers is desirably 1/10 or less, so far as the foil thickness is 200 μm. For example, such a ranges as diameter level: 1-5 μm and length level: 5-15 μm are desirable.

INDUSTRIAL APPLICABILITY

The present invention provides an electronic device and a semiconductor device based on quite novel solder bonding. Particularly, solder bonding on the high temperature side in the temperature-hierarchical bonding can be obtained.

Furthermore, the present invention provides a novel solder foil with a highly industrial utility.

The invention claimed is:

1. A semiconductor device comprising:

a semiconductor chip, a tab on which the semiconductor chip is to be disposed, a lead serving as an output connector terminal, and a wire which is configured to electrically bond an electrode on the semiconductor chip to the lead, wherein the semiconductor chip and the tab are bonded to together by connection portions containing a solder foil formed from a solder material comprising Cu particles and Sn particles by rolling so as to subject the Sn particles to plastic flow-through between the Cu particles, whereby preventing generation of voids during or after the solder bonding process, wherein the Cu particles are not melted at a soldering temperature of the soldering foil, but the plastically flowing Sn particles are melted to react with the Cu particles at the soldering temperature of the soldering foil, wherein the connection portions further contain a CuSn compound containing $Cu_6Sn_5$ which is not melted at the soldering temperature of the soldering foil, and the CuSn compound bonds the Cu particles together.

2. A semiconductor device according to claim 1, wherein the solder material contains the Cu particles in a volume ratio between 50% and 60% and the Sn particles in a volume ratio between 40% and 50%.

3. A semiconductor device according to claim 1, wherein the Cu particles and the Sn particles are balls.

4. A semiconductor device according to claims 1, wherein the solder material contains at least one of the materials selected from the group consisting of: Ag, Bi, Cu, Zn, Ni, Pd, and Au, in addition to the Cu particles and the Sn particles.

5. A semiconductor device according to claim 1, wherein the solder foil is plated with Sn or a plating material comprising Sn and at least one of the following materials: Bi, In, Ag, Au, Cu, Ni, and Pd.

* * * * *